(12) United States Patent
Raney et al.

(10) Patent No.: US 9,499,903 B2
(45) Date of Patent: *Nov. 22, 2016

(54) CARBON NANOTUBE FOAMS WITH CONTROLLABLE MECHANICAL PROPERTIES

(71) Applicant: CALIFORNIA INSTITUTE OF TECHNOLOGY, Pasadena, CA (US)

(72) Inventors: Jordan R. Raney, Pasadena, CA (US); Chiara Daraio, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/700,035

(22) Filed: Apr. 29, 2015

(65) Prior Publication Data

US 2015/0329961 A1 Nov. 19, 2015

Related U.S. Application Data

(62) Division of application No. 13/491,014, filed on Jun. 7, 2012, now Pat. No. 9,045,343.

(60) Provisional application No. 61/512,318, filed on Jul. 27, 2011.

(51) Int. Cl.
| | | |
|---|---|---|
| *H01L 21/00* | (2006.01) | |
| *C23C 16/26* | (2006.01) | |
| *C23C 16/01* | (2006.01) | |
| *C23C 16/52* | (2006.01) | |
| *C01B 31/02* | (2006.01) | |

(Continued)

(52) U.S. Cl.
CPC ............... *C23C 16/26* (2013.01); *B82Y 30/00* (2013.01); *B82Y 40/00* (2013.01); *C01B 31/0226* (2013.01); *C01B 31/0233* (2013.01); *C01B 31/0273* (2013.01); *C01B 31/0438* (2013.01); *C23C 16/01* (2013.01); *C23C 16/52* (2013.01); *C01B 2202/06* (2013.01); *C01B 2202/08* (2013.01); *C01B 2202/26* (2013.01); *Y10T 428/24983* (2015.01)

(58) Field of Classification Search
None
See application file for complete search history.

(56) References Cited

U.S. PATENT DOCUMENTS

| | | |
|---|---|---|
| 3,328,124 A | 6/1967 | Mays et al. |
| 6,872,403 B2 | 3/2005 | Pienkowski et al. |

(Continued)

FOREIGN PATENT DOCUMENTS

WO 2011/143777 11/2011

OTHER PUBLICATIONS

Abbaslou R.M., et al. "The effects of carbon concentration in the precursor gas on the quality and quantity of carbon nanotubes synthesized by CVD method." Applied Catalysis A: General 2010; 372(2):pp. 147-152.

(Continued)

*Primary Examiner* — Evren Seven
(74) *Attorney, Agent, or Firm* — Steinfl & Bruno, LLP

(57) ABSTRACT

Syntheses of carbon nanotubes (CNT) are disclosed. The syntheses can take place on a thermally oxidized silicon surface placed inside a furnace prior to a reaction. The setup can have many variables that could affect the resulting CNT arrays, including flow rate and composition of carrier gas, flow rate and composition of precursor solution, and temperature. By varying such variables the density of the resulting CNT arrays can be controlled.

5 Claims, 17 Drawing Sheets

(51) Int. Cl.
B82Y 30/00 (2011.01)
B82Y 40/00 (2011.01)
C01B 31/04 (2006.01)

(56) References Cited

U.S. PATENT DOCUMENTS

| | | | |
|---|---|---|---|
| 7,204,970 | B2 | 4/2007 | Smalley et al. |
| 7,727,624 | B2 | 6/2010 | Cao et al. |
| 2002/0102193 | A1 | 8/2002 | Smalley et al. |
| 2006/0073089 | A1 | 4/2006 | Ajayan et al. |
| 2009/0200912 | A1 | 8/2009 | Ren et al. |
| 2009/0208403 | A1 | 8/2009 | Hussain et al. |
| 2009/0208708 | A1 | 8/2009 | Wei et al. |
| 2009/0278114 | A1 | 11/2009 | Grill et al. |
| 2010/0029063 | A1 | 2/2010 | Gambin |
| 2010/0083489 | A1 | 4/2010 | Eldridge et al. |
| 2010/0187484 | A1 | 7/2010 | Worsley et al. |
| 2010/0227058 | A1 | 9/2010 | Zhang et al. |
| 2011/0133031 | A1 | 6/2011 | Shah et al. |
| 2011/0255212 | A1 | 10/2011 | Liu et al. |

OTHER PUBLICATIONS

Abot J.L., et al. "On the mechanical response of carbon nanotube array laminated composite materials." Journal of Reinforced Plastics & Composites 2010; 29(22): pp. 3401-3410.
Aksak M, et al. "Carbon nanotube diameter tuning using hydrogen amount and temperature on SiO2 /Si substrates." Applied Physics A: Materials Science & Processing 2010; 100(1): pp. 213-222.
Andrews R, et al. "Continuous production of aligned carbon nanotubes: a step closer to commercial realization." Chemical Physics Letters 1999; 303(5-6):pp. 467-474.
Antkowiak, A. et al., "Instant fabrication and selection of folded structures using drop impact." *PNAS*, Jun. 28, 2011, vol. 108, No. 26, pp. 10400-10404.
Arnold M.S., et al. "Sorting carbon nanotubes by electronic structure using density differentiation." Nature Nanotechnolo , 2006, vol. 1, 60-5.
Barker, M. K., et al. "The Relationship of the Compressive Modulus of Articular Cartilage with its Deformation Response to Cyclic Loading: Does Cartilage Optimize its Modulus so as to Minimize the Strains Arising in it Due to the Prevalent Loading Regime?" Rhumatology 2001, vol. 40, pp. 274-284.
Baughman, R. H., et al. "Carbon Nanotube Actuators." Science 1999, 284, pp. 1340-1344.
Baughman, R.H. et al. "Carbon nanotubes: the route toward applications." Science 2002; 297(5582): pp. 787-792.
Behr, M.J. et al. "Effect of hydrogen on catalyst nanoparticles in carbon nanotube growth" *Journal of Applied Physics* 108, (2010) pp. 053303-1-053303-8.
Bittencourt C, et al. "Decorating Carbon Nanotubes with Nickel Nanoparticles." Chem. Phys. Lett. 2007; 436(4-6): pp. 368-372.
Bradford P.D., et al. "Tuning the compressive mechanical properties of carbon nanotube foam." Carbon 2011;49(8): pp. 2834-2841.
Britz, et al. "Noncovalent interactions of molecules with single walled carbon nanotubes" Chem. Soc. Rev. 2006, vol. 35, pp. 637-659.
Cao, A., et al. "Macroscopic three dimensional arrays of Fe nanoparticles supported in aligned carbon nanotubes." J. Phys. Chem. B 2001, 105, pp. 11937-11940.
Cao, A., et al. "Super-Compressible Foam Like Carbon Nanotube Films." Science 2005, 310, 1307-1310.
Chakrabarti S, et al. "Number of walls controlled synthesis of millimeter-long vertically aligned brushlike carbon nanotubes." Journal of Physical Chemistry C 2007; 111(5):1929-34.
Chakrapani N., et al. "Capillarity-driven assembly of two-dimensional cellular carbon nanotube foams." Proc. Natl Acad. Sci. 101 4009-12; 2004.

Chandrashekar A, et al. "Forming Carbon Nanotube Composites by Directly Coating Forests with Inorganic Materials Using Low Pressure Chemical Vapor Deposition." Thin Solid Films 2008; 517(2):525-30.
Ci, L. et al. "Continuous Carbon Nanotube Reinforced Composites." Nano Lett. 2008, 5 pages.
Cui X, et al. "Effect of catalyst particle interspacing on the growth of millimeter-scale carbon nanotube arrays by catalytic chemical vapor deposition." Carbon 2009;47 (15):3441-51.
Cui, L., et al. "Designing the energy absorption capacity of functionally graded foam materials." Materials Science and Engineering A 2009, 507, 215-225.
Cui. Dense and long carbon nanotube arrays decorated with Mn3O4 nanoparticles for electrodes of electrochimical supercapacitors, Carbon 49, 2011, pp. 1225-1234.
Daraio, C., et al. "Highly Nonlinear Contact Interaction and Dynamic Energy Dissipation by Forest of Carbon Nanotubes." Appl. Phys. Lett. 2004, 85, 5724-5726.
De Falco, I, et al. "A comparative analysis of evolutionary algorithms for function optimization." In: Proceedings of the Second Workshop on Evolutionary Computation (WEC2), Nagoya, Japan; 1996. p. 29-32.
de Heer W.A., et al. "A carbon nanotube field-emission electron source." Science 1995;270 (5239):1179-80.
Deck, C. P., et al. "Growth of well-aligned carbon nanotube structures in successive layers." J. Phys. Chem. B 2005, 109, 12353-12357.
Deck, C.P., et al. "Mechanical behavior of ultralong multiwalled carbon nanotube mats." J. Appl. Phys. 101 023512, 2007.
Dong L, et al. "Effects of hydrogen on the formation of aligned carbon nanotubes by chemical vapor deposition." Journal of Nanoscience and Nanotechnology 2002;2(2):155-60.
Dresselhaus M.S., et al. "Raman spectroscopy of carbon nanotubes." Physics Reports 2005;409 (2):47-99.
Du, M. et al. "Modification of silica nanoparticles and their application in UDMA dental polymeric composites." Polym. Compos. 28 198-207; 2007.
Eder, D. "Carbon Nanotube-Inorganic Hybrids." Chem. Rev. 2010; 110(3):1348-85.
El Sayed ,T, et al. "A variational constitutive model for soft biological tissue." J Biomech 2008;41:1458-66.
Ellis, V, et al. "Hydrophobic anchoring of monolayer-protected gold nanoclusters to carbon nanotubes." Nano Lett. 3 (3). pp. 279-282. ISSN 1530-6984, 2003.
Falvo, M.R., et al. "Bending and Buckling of Carbon Nanotubes Under Large Strain." Nature 1997; 389(6651):582-4.
Feng, X, et al. "Thermal analysis study of the growth kinetics of carbon nanotubes and epitaxial graphene layers on them." Journal of Physical Chemistry C 2009; 113(22):9623-31.
Fraternali, F, et al. "Multiscale mass-spring models of carbon nanotube foams." J Mech Phys Solids 2011;59(1):89-102.
Fraternali, F, et al. "Optimal design of composite granular protectors." Mech Adv Mater Struct 2010;17(1):1-19.
Gama, B. A., et al. "Aluminum Foam Integral Armor:A New Dimension in Armor Design." Compos. Struct. 2001,52, 381-395.
Garcia, E.J., et al. Fabrication and nanocompression testing of aligned carbon-nanotube-polymer nanocomposites. Adv Mater 2007; 19(16):2151-6.
Gui, X, et al. "Soft, highly conductive nanotube sponges and composites with controlled compressibility." ACS Nano 4 2320-6, 2010.
Guo G, et al. "A Simple Method to Prepare Multi-Walled Carbon Nanotube/ZnO Nanoparticle Composites." Appl. Phys. A. 2007; 89(2):525-8.
Han W.Q., et al. "Coating Single-Walled Carbon Nanotubes with Tin Oxide." Nano Lett. 2003; 3(5):681-3.
Han, C., et al. "Attenuation of Stress Wave Propagation in Periodically Layered Elastic Media." J. Sound Vib. 2001, 243, 747-761.
Holland, J.H., et al. "Outline for a logical theory of adaptive systems." J ACM 1962;9(3): pp. 297-314.
Hutchens, S.B., et al. "In situ mechanical testing reveals periodic buckle nucleation and propagation in carbon nanotube bundles." Advanced Functional Materials 2010; 20(14): pp. 2338-2346.

(56) References Cited

OTHER PUBLICATIONS

Iijima, S., et al. "Structural flexibility of carbon nanotube." J. Structural Flexibility of Carbon Nanotubes. J. Chem. Phys. 1996, 104, pp. 2089-2092.
Jackson, J.J. et al., *Pulsed Growth of Vertically Aligned Nanotube Arrays with Variable Density*, ACS Nano, 2010, 4, pp. 7573-7581.
Jin, X, et al. "Nanoscale Microelectrochemical Cells on Carbon Nanotubes." Small 2007; 3(9): pp. 1513-1517.
Kaur, S. et al. "Capillarity-driven assembly of carbon nanotubes on substrates into dense vertically aligned arrays." Adv. Mater. pp. 192984-192987; 2007.
Kiernan, S., et al. "Propagation of a stress wave through a virtual functionally graded foam." International Journal of Non-Linear Mechanics 2009, 44, pp. 456-468.
Kireitseu, M. V. "Vibration Damping Properties of Nanotube-Reinforced Materials." Adv. Sci. Technol. 2006, 50, pp. 31-36.
Kireitseu, M. V., et al. "Damping Properties of Sandwich Metal-Polymer-Ceramic Coating." Mater. Technol.; Ocean Eng. 2007, 4, pp. 21-26.
Kuang Q, et al. "Controllable Fabrication of SnO2-Coated Multiwalled Carbon Nanotubes by Chemical Vapor Deposition." Carbon 2006; 44(7): pp. 1166-1172.
Lee, C.J., et al. "Temperature effect on the growth of carbon nanotubes using thermal chemical vapor deposition." Chemical Physics Letters 2001; 343(1-2): pp. 33-38.
Li X, et al. "Air-assisted growth of ultra-long carbon nanotube bundles." Nanotechnology 2008;19(45):455609 7 pages.
Li X, et al. "Densified Aligned Carbon Nanotube Films via Vapor Phase Infiltration of Carbon." Carbon 2007; 45(4): pp. 847-851.
Li Y., et al. "Growth of single-walled carbon nanotubes from discrete catalytic nanoparticles of various sizes." Journal of Physical Chemistry B 2001;105(46):11424-31.
Li, et al. "Efficient Synthesis of Carbon Nanotube-Nanoparticle Hybrids" Adv. Funct. Mater. 2006, vol. 16, pp. 2431-2437.
Li, W.Z., et al. "Large-scale synthesis of aligned carbon nanotubes." Science 1996;274(5293):1701-3.
Li, X. et al., *Bottom-up growth of carbon nanotube multilayers: unprecedented growth*, Nano Letters, 2005, 5, pp. 1997-2000.
Liu L, et al. "Macroscopic Carbon Nanotube Assemblies: Preparation, Properties, and Potential Applications." Small 2011; 7(11):1504-20.
Liu, M. et al. "Thickness Dependent Mechanical Properties of Polydimethyl Siloxane Membranes." J. Micromech. Microeng. 2009, 19, 035028-035031.
Liu, Q, et al. "Diameter selective growth of single-walled carbon nanotubes with high quality by floating catalyst method." ACS Nano 2008;2(8):1722-8.
Liu, Y, et al. "Kabob-Like Carbon Nanotube Hybrids." Chem. Lett. 2006; 35(2):200-1.
Loret, B., et al. "Articular Cartilage with Intra- and Extrafibrillar Waters: a Chemo-Mechanical Model." Mech. Mater. 2004, 36, 515-541.
Lu, C. et al. "Controlling the diameter of carbon nanotubes in chemical vapor deposition method by carbon feeding" *J. Phys. Chem. B* 110, (2006) 20254-20257.
Ma, S.B., et al. "Synthesis and Characterization of Manganese Dioxide Spontaneously Coated on Carbon Nanotubes." Carbon 2007; 45(2): pp. 375-382.
Maghrebi, M. et al. "Acetic acid effects on enhancement of growth rate and reduction of amorphous carbon deposition on CNT arrays along a growth window in a floating catalyst reactor." Applied Physics A: Materials Science & Processing 2009;97(2): pp. 417-424.
Misra A, et al. "Synthesis and characterization of carbon nanotube-polymer multilayer structures", ACS Nano 2011;5(10):7713-7721.
Moon, S.Y. et al. "Easy Synthesis of a Nanostructured Hybrid Array Consisting of Gold Nanoparticles and Carbon Nanotubes." Carbon 2009, 47(12):2924-32.

Mühlenbein H., "The science of breeding and its application to the Breeder Genetic Algorithm (BGA)." Evol Comput 1994;1(4):335-60.
Mylvaganam, K.., et al. "Energy Absorption Capacity of Carbon Nanotubes Under Ballistic Impact." Appl. Phys. Lett. 2006, 89, 123127-123130.
Namilae, S. et al. "Role of atomic scale interfaces in the compressive behavior of carbon nanotubes in composites." Compos. Sci. Technol. 66:13, pp. 2030-2038, Oct. 2006.
Naraghi, M. et al. "A Multiscale Study of High Performance Double-Walled Nanotube-Polymer Fibers." ACS Nano 2010, 4, 6463-6476.
Neocleus, S. et al., "Hierarchical Carbon Nanotube-Inorganic Hybrid Structures Involving CNT Arrays and CNT Fibers." Func. Mater. Lett. 2011; 4(1):83-9.
Nessim, G.D. et al., *Tuning of vertically-aligned carbon nanotube diameter and areal density through catalyst pre-treatement*, Nano Letters, 2008, 8(11), pp. 3587-3593.
Ng K.C., et al. "Individual and Bipolarly Stacked Asymmetrical Aqueous Supercapacitors of CNTs/SnO2 and CNTs/MnO2 Nanocomposites." J. Electrochem. Soc. 2009; 11:A846-53.
O'Connell, M.J. et al. "Band gap fluorescence from individual single-walled carbon nanotubes", Science 297 593-6; 2002.
Okita, A. et al., *Effects of hydrogen on carbon nanotube formation in CH4/H2 plasmas*, Carbon, 2007, 45(7), pp. 1518-1526.
Otieno, G., et al. "Processing and Properties of Aligned Multi-Walled Carbon Nanotube/Aluminoborosilicate Glass Composites Made by Sol- Gel Processing." Carbon 2010; 48(8):2212-7.
PCT International Search Report issued for PCT Application No. PCT/US2012/041275 filed on Jun. 7, 2012 in the name of California Institute of Technology et al. Mail Date: Apr. 25, 2013. 3 pages.
PCT Written Opinion issued for PCT Application No. PCT/US2012/041275 filed on Jun. 7, 2012 in the name of California Institute of Technology et al. Mail Date: Apr. 25, 2013. 5 pages.
Pinault, M, et al. "Evidence of Sequential Lift in Growth of Aligned Multiwalled Carbon Nanotube Multilayers." Nano Letters 2005; 5: pp. 2394-2398.
Pint Three dimensional solid-state supercapacitors from aligned single-walled carbon nanotube array templates, Carbon 49, 2011, pp. 4890-4897.
Puglisi, G, et al. "Thermodynamics of rate independent plasticity." J Mech Phys Solids 2005;53(3): pp. 655-679.
Pushparaj, V. L., et al. "Effects of Compressive Strains on Electrical Conductivities of a Macroscale Carbon Nanotube Block." Appl. Phys. Lett. 2007,91, pp. 153116-153118.
Qian, D., et al., "Mechanics of Carbon Nanotubes." Appl. Mech. Rev. 2002; 55(6): pp. 495-532.
Ramachandra, S., et al. "Impact Energy Absorption in an Al Foam at Low Velocities." Scr. Mater. 2003, 49, pp. 741-745.
Rance, G.A., et al. "van der Waals interactions between nanotubes and nanoparticles for controlled assembly of composite nanostructures." ACS Nano. 4(8):, Aug. 24, 2010 pp. 4920-4928.
Raney, J. R., et al. "Modeling and in Situ Identification of Material Parameters for Layered Structures Based on Carbon Nanotube Arrays." Compos. Struct. 2011, 93, pp. 3013-3018.
Raney, J.R. et al., *Tailoring the microstructure and mechanical properties of arrays of aligned multiwall carbon nanotubes by utilizing different hydrogen concentrations during synthesis*, Carbon, 2011, 49, pp. 3631-3638.
Raney, J.R., et al. "In situ synthesis of metal oxides in carbon nanotube arrays and mechanical properties of the resulting structures." Carbon 50 (2012); 4432-4440.
Romo-Negreira, A, et al. "Electrochemical tailoring of catalyst nanoparticles for CNT spatial-dimension control." Journal of the Electrochemical Society 2010;157(3): pp. K47-K51.
Sansom, E. B., et al. "Controlled Partial Embedding of Carbon Nanotubes within Flexible Transparent Layers." Nanotechnology 2008, 19, pp. 035302-035308.
Shin, M. et al. "Elastomeric Conductive Composites Based on Carbon Nanotube Forests." Adv. Mater. 2010, 22, pp. 2663-2667.
Suhr, J. et al. "Fatigue resistance of aligned carbon nanotube arrays under cyclic compression." Nature Nano 2007;2(7): pp. 417-421.

(56) References Cited

OTHER PUBLICATIONS

Suhr, J., et al. "Viscoelasticity in Carbon Nanotube Composites." Nat. Mater. 2005, 4, pp. 134-137.
Suresh, S. et al. "Graded materials for resistance to contact deformation and damage." Science 2001; 292(5526): pp. 2447-2451.
Tong, T. et al. "Height independent compressive modulus of vertically aligned carbon nanotube arrays." Nano Letters 2008;8(2): pp. 511-515.
Toth, G. et al. "Carbonnanotube-based electrical brush contacts." Adv Mater 2009; 21(20): pp. 2054-2058.
Tummala, N.R., et al. "SDS surfactants on carbon nanotubes: aggregate morphology." ACS Nano. (3) 2009 pp. 595-602.
Vaisman, L., et al. "The role of surfactants in dispersion of carbon nanotubes." Adv. Colloid Interface Sci. 128 2006 pp. 37-46.
Wang, C.M., et al. "Recent studies on buckling of carbon nanotubes." Applied Mechanics Reviews 2010;63(3): pp. 030804-1-030804-18.
Wang, E. et al. "The blast resistance of sandwich composites with stepwise graded cores." International Journal of Solids and Structures 2009, 46, pp. 3492-3502.
Wang, W., et al., "Vertically Aligned Silicon/Carbon Nanotube (VASCNT) Arrays: Hierarchical Anodes for Lithium-Ion Battery." Electrochem. Comm. 2011; 13(5): pp. 429-432.
Wasel, W., et al. "Experimental characterization of the role of hydrogen in CVD Synthesis of MWCNTs." Carbon 2007;45(4): pp. 833-838.
Xia Nanoflaky MnO2/carbon nanotube nanocomposites as anode materials for lithium-ion batteries, Journal of Materials Chemistry, 2010 vol. 20, pp. 6896 6902.
Xie, X.L., et al. "Dispersion and Alignment of Carbon Nanotubes in Polymer Matrix: A Review." Mater. Sci. Eng. R 2005; 49(4): pp. 89-112.
Yakobson, B.I., et al."Nanomechanics of Carbon Tubes: Instabilities beyond Linear Response." Phys. Rev. Lett. 1996; 76(14): pp. 2511-2514.
Yang, J., et al. A New Device for Measuring Density of Jaw Bones. Dentomaxillo facial Radiol. 2002, 31, pp. 313-316.
Yurekli, K, et al. "Small-angle neutron scattering from surfactant-assisted aqueous dispersions of carbon nanotubes." J. Am. Chem. Soc. 126 2004, pp. 9902-9903.
Zhang "Carbon nanotube arrays and their composites for electrochemical capacitors and lithium-ion batteries" Jul. 2009, Energy and Environmental Science, 2. pp. 932-943.
Zhang H., et al. "Influence of ethylene and hydrogen flow rates on the wall number, crystallinity, and length of millimeter-long carbon nanotube array." Journal of Physical Chemistry C 2008;112(33):12706-9.
Zhang, G. et al., *Ultra-high-yield growth of vertical single-walled carbon nanotubes: hidden roles of hydrogen and oxygen*, Proceedings of the National Academy of Sciences of the United States of America, 2005,102(45), pp. 16141-16145.
Zhang, H.L., et al. "Kinetically Controlled Catalytic Synthesis of Highly Dispersed Metal-in-Carbon Composite and its Electrochemical Behavior." J. Mater. Chem. 2009; 19(47): pp. 9006-9011.
Zhang, M., et al. "Multifunctional Carbon Nanotube Yarns by Downsizing an Ancient Technology." Science 2004, 306, pp. 1358-1361.
Zhang, Q., et al. "Energy-Absorbing Hybrid Composites Based on Alternate Carbon-Nanotube and Inorganic Layers." Adv. Mater. 2009, 21, pp. 2876-2880.
Zhang, Y. et al. "Tailoring the morphology of carbon nanotube arrays: from spinnable forests to undulating foams" ACS NANO 3(8) (2009) pp. 2157-2162.
Zhao, B., et al. "Improvement on Wettability Between Carbon Nanotubes and Sn." Surface Engineering 2009; 25(1):pp. 31-35.
Zhou, J.J., et al. "Flow conveying and diagnosis with carbon nanotube arrays." Nanotechnology 17, 2006, pp. 4845-4853.
Restriction Requirement for U.S. Appl. No. 13/866,596 filed Apr. 19, 2013 on behalf of Chiara Daraio. Mail Date: Oct. 2, 2015. 7 pages.
Non-Final Office Action for U.S. Appl. No. 13/866,596, filed Apr. 19, 2013 on behalf of Chiara Daraio. Mail Date: Mar. 3, 2016. 17 pages.
Restriction Requirement for U.S. Appl. No. 13/870,954, filed Apr. 25, 2013 on behalf of Chiara Daraio. Mail Date: Oct. 2, 2015. 7 pages.
Non-Final Office Action for U.S. Appl. No. 13/870,954, filed Apr. 25, 2013 on behalf of Chiara Daraio. Mail Date: Mar. 22, 2016. 23 pages.
Non-Final Office Action for U.S. Appl. No. 13/491,014, filed Jun. 7, 2012 on behalf of Jordan R. Raney. Mail Date: Feb. 5, 2014. 14 pages.
Non-Final Office Action for U.S. Appl. No. 13/491,014, filed Jun. 7, 2012 on behalf of Jordan R. Raney. Mail Date: Oct. 3, 2014. 8 pages.
Notice of Allowance for U.S. Appl. No. 13/491,014, filed Jun. 7, 2012 on behalf of Jordan R. Raney. Mail Date: Feb. 18, 2015. 8 pages.
Restriction Requirement for U.S. Appl. No. 13/868,952, filed Apr. 23, 2013 on behalf of Abha Misra. Mail Date: Dec. 1, 2014. 6 pages.
Non-Final Office Action for U.S. Appl. No. 13/868,952, filed Apr. 23, 2013 on behalf of Abha Misra. Mail Date: Feb. 26, 2015. 20 pages.
Final Office Action for U.S. Appl. No. 13/868,952, filed Apr. 23, 2013 on behalf of Abha Misra. Mail Date: Sep. 11, 2015. 20 pages.
Advisory Action for U.S. Appl. No. 13/868,952, filed Apr. 23, 2013 on behalf of Abha Misra. Mail Date: Feb. 22, 2016. 4 pages.
Non-Final Office Action for U.S. Appl. No. 13/868,952, filed Apr. 23, 2013 on behalf of Abha Misra. Mail Date: Apr. 5, 2016. 11 pages.
Ajayan, P. M.; Schadler, L. S.; Giannaris, C.; Rubio, A. Single Walled Carbon Nanotube: Polymer Composites: Strength and Weakness. Adv. Mater. 2000, 12, 750-753.
Ajdari, A. et al., *Dynamic crushing and energy absorption of regular, irregular and functionally graded cellular structures*, International Journal of Solids and Structures, 2011, 48, pp. 506-516.
Bottini, M. et al. "Covalent decoration of multi-walled carbon nanotubes with silica nanoparticles" *Chem. Commun.* (2005) 758-760.
Final Office Action mailed on Sep. 11, 2015 for U.S. Appl. No. 13/868,952, filed Apr. 23, 2013 in the name of California Institute of Technology.
Misra, A. et al., *Effect of density variation and non-covalent functionalization on the compressive behavior of carbon nanotube arrays*, Nanotechnol., 2011, 22, 425705, pp. 1-7.
Misra, A. et al., *Strain rate effects in the mechanical response of polymer-anchored carbon nanotube foams*, Adv. Mater., 2009, 21, pp. 334-338.
Non-Final Office Action mailed on Feb. 26, 2015 for U.S. Appl. No. 13/868,952, filed Apr. 23, 2013 in the name of California Institute of Technology.
Non-Final Office Action mailed on Feb. 5, 2014 for U.S. Appl. No. 13/491,014, filed Jun. 7, 2012 in the name of California Institute of Technology.
Non-Final Office Action mailed on Oct. 3, 2014 for U.S. Appl. No. 13/491,014, filed Jun. 7, 2012 in the name of California Institute of Technology.
Notice of Allowance mailed on Feb. 18, 2015 for U.S. Appl. No. 13/491,014, filed Jun. 7, 2012 in the name of California Institute of Technology.
Restriction Requirement mailed on Oct. 2, 2015 for U.S. Appl. No. 13/866,596, filed Apr. 19, 2013 in the name of California Institute of Technology.
Restriction Requirement mailed on Oct. 2, 2015 for U.S. Appl. No. 13/870,954, filed Apr. 25, 2013 in the name of California Institute of Technology.
Yaglioglu O., "Carbon nanotube based electromechanical probes." Massachusetts Institute of Technology, PhD Thesis, Cambridge, MA, USA, Jun. 2007.

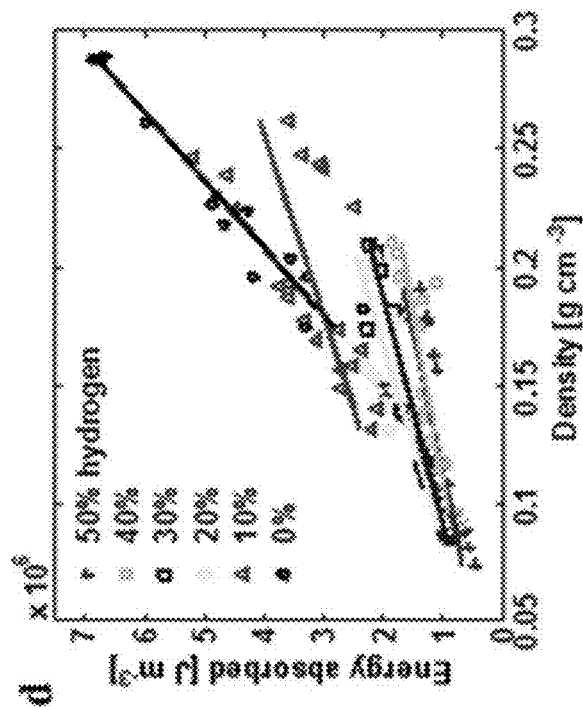
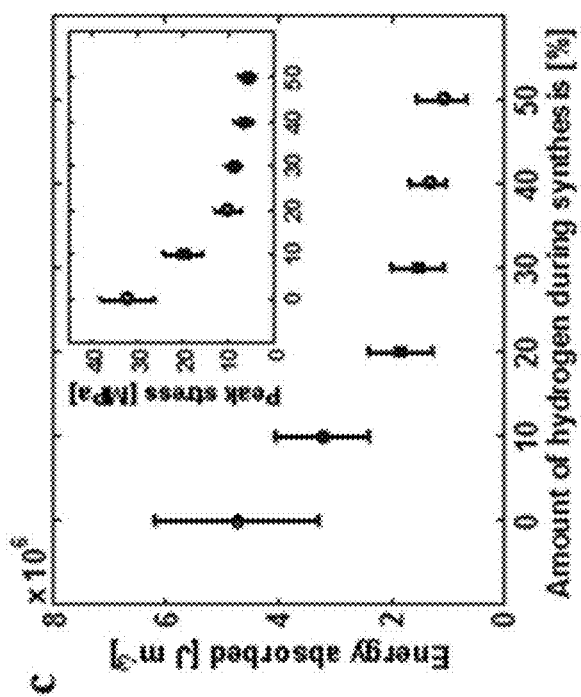
FIG. 5D
FIG. 5C

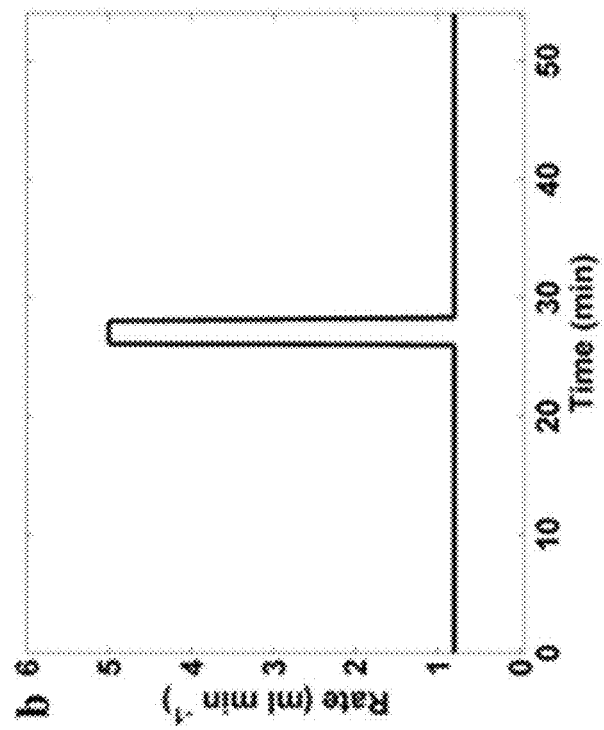
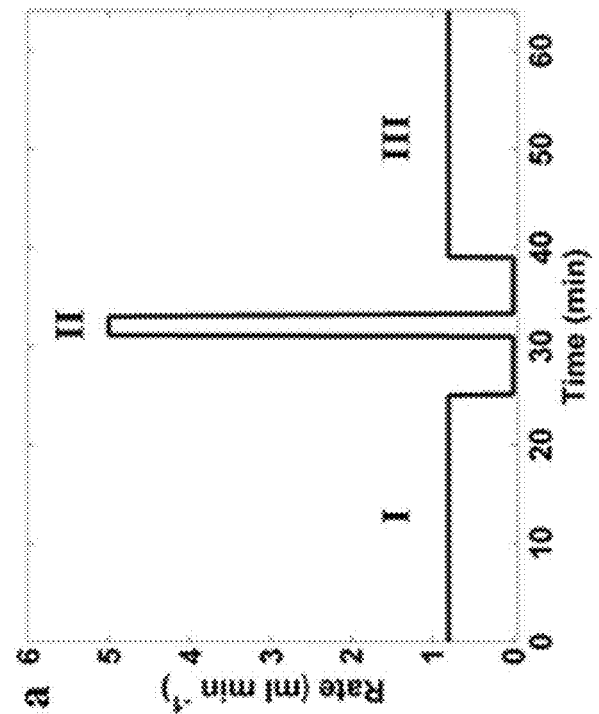
FIG. 8A
FIG. 8B

CARBON NANOTUBE FOAMS WITH CONTROLLABLE MECHANICAL PROPERTIES

CROSS REFERENCE TO RELATED APPLICATIONS

The present application is a Divisional of U.S. application Ser. No. 13/491,014 filed on Jun. 7, 2012, which is incorporated herein by reference in its entirety, which, in turn claims priority to U.S. provisional application 61/512,318 for "Carbon Nanotube Foams with Controllable Mechanical Properties" filed on Jul. 27, 2011, which is incorporated herein by reference in its entirety.

STATEMENT OF GOVERNMENT GRANT

This invention was made with government support under W911NF-09-D-0001 awarded by United States Army. The government has certain rights in the invention.

FIELD

The present disclosure relates to a method for synthesizing nominally-aligned arrays of carbon nanotubes (CNTs) to obtain a foam structure and to a method for controlling mechanical properties of the foam structure during a synthesis process. Moreover, the present disclosure relates to carbon nanotube foams with controllable mechanical properties.

BACKGROUND

Nominally-aligned arrays of carbon nanotubes (CNTs) are known to behave as low-density energy dissipative foams under compression. The material can be readily synthesized using standard thermal chemical vapor deposition techniques, resulting in a foam-like bulk material consisting of trillions of CNTs per square centimeter. However, these systems have remained largely unused in practical applications due to large variations in properties that result from the synthesis process.

SUMMARY

According to a first aspect of the present disclosure, a method for synthesizing nominally-aligned arrays of carbon nanotubes (CNTs) is described, the method comprising determining synthesis parameters for synthesizing the CNTs; determining a relationship between at least one of the synthesis parameters and a diameter of the CNTs, wherein variation of the at least one of the synthesis parameters affects the diameter of the CNTs; establishing at least one operative value of the at least one of the synthesis parameters based on said relationship and with respect to the diameter to be obtained; and synthesizing the CNTs by applying the at least one operative value of the at least one of the synthesis parameters to obtain a foam structure of the nominally-aligned arrays of carbon nanotubes (CNTs).

According to a second aspect of the present disclosure, a method for controlling mechanical properties in a carbon nanotube foam structure is described, the method comprising synthesizing the carbon nanotube foam structure by carrying a precursor solution comprising a catalyst and a carbon source in a reaction zone by way of a carrier gas; and controlling or varying a concentration of the carrier gas to affect the mechanical properties of the carbon nanotube foam structure.

According to a third aspect of the disclosure, a method for controlling mechanical properties in a carbon nanotube foam structure is described, the method comprising synthesizing the carbon nanotube foam structure by carrying a precursor solution comprising a catalyst and a carbon source in a reaction zone by way of a carrier gas; and controlling or varying an input of precursor solution to affect the mechanical properties of the carbon nanotube foam structure.

According to a fourth aspect of the disclosure, a method for controlling mechanical properties in a carbon nanotube foam structure is described, the method comprising synthesizing the carbon nanotube foam structure by carrying a precursor solution comprising a catalyst and a carbon source in a reaction zone by way of a carrier gas including hydrogen to obtain the carbon nanotube foam structure; and controlling or varying a concentration of hydrogen in the carrier gas to affect the carbon nanotube foam structure and to control the mechanical properties of the carbon nanotube foam structure; and controlling or varying an input rate of the precursor solution to affect an average carbon nanotube diameter in the foam structure and to control the mechanical properties of the carbon nanotube foam structure.

According to a fifth aspect of the present disclosure, a method for synthesizing nominally-aligned arrays of carbon nanotubes (CNTs) is described, the method comprising synthesizing a foam structure of nominally-aligned arrays of carbon nanotubes (CNTs) by carrying a precursor solution comprising a catalyst and a carbon source in a reaction zone by way of a carrier gas to obtain the foam structure; and determining a relationship between a flow direction of the carrier gas carrying the precursor solution and a density of the foam structure; and synthesizing the CNTs by controlling the flow direction rate of the carrier gas in relation to a growth of the nominally-aligned arrays of carbon nanotubes to alter a density of the foam structure.

Further aspects of the disclosure are shown in the specification, drawings and claims of the present application.

BRIEF DESCRIPTION OF THE DRAWINGS

FIG. 5C shows an average energy absorbed per unit volume calculated for a first compressive cycle for each hydrogen concentration.

FIG. 5D shows an energy absorbed in a first compressive cycle plotted as a function of density for all concentrations of hydrogen.

FIG. 8A shows a diagram of the input rate of the precursor feedstock as a function of time that is used for synthesis of a single "discrete" band.

FIG. 8B shows a diagram of the input rate of the precursor feedstock as a function of time that is used for synthesis of a "continuous" band.

DETAILED DESCRIPTION

Various embodiments of the present disclosure will now be described more fully with reference to the accompanying drawings. The words and phrases used in the present disclosure should be understood and interpreted to have a meaning consistent with the understanding of those words and phrases by those skilled in the relevant art. For example, in the present disclosure, the expression "nominally-aligned arrays of carbon nanotubes" can mean ordered structures or arrangements of nanotubes which naturally align themselves and are held together by van der Waals forces and lateral entanglement of the CNTs, which are not perfectly parallel (hence "nominally-aligned"). The alignment refers to "bundles" or "groups" of CNTs, and not specifically on the alignment of the individual tubes in the arrangement. In addition, the term "synthesis", which is, for example, included in the expressions "synthesis process", "synthesis parameters" or "method for synthesizing", can mean a process in which volatile or gas-phase precursors including a carbon source react on a substrate, leading to nanotube growth. In some embodiments of the present disclosure, the synthesis is a process based on chemical vapor deposition (CVD). In particular, according to some embodiments of the present disclosure, CVD synthesis is achieved by taking carbon species in the gas phase and using an energy source, such as a plasma, a resistively heated coil or heat in general, such as the heat of a heated furnace, to impart energy to a gaseous carbon molecule. Commonly used gaseous carbon sources can include toluene, methane, carbon monoxide, and acetylene. The energy source can be used to "crack" the carbon molecule into a reactive radical species. These radical reactive species can then diffuse down to the substrate, which is heated and coated in a catalyst (usually a first row transition metal such as Ni, Fe, or Co) where it will bond. According to some embodiments, the synthesis of nominally-aligned CNTs can include a floating catalyst thermal chemical vapor deposition (TCVD) system that can include a reaction zone (furnace), a precursor solution including a catalyst and a carbon source, and a carrier gas to move the solution into the reaction zone. The synthesis of the CNTs can take place on a thermally oxidized surface, for example Si surface, placed inside the furnace prior to the reaction.

Figure 2:
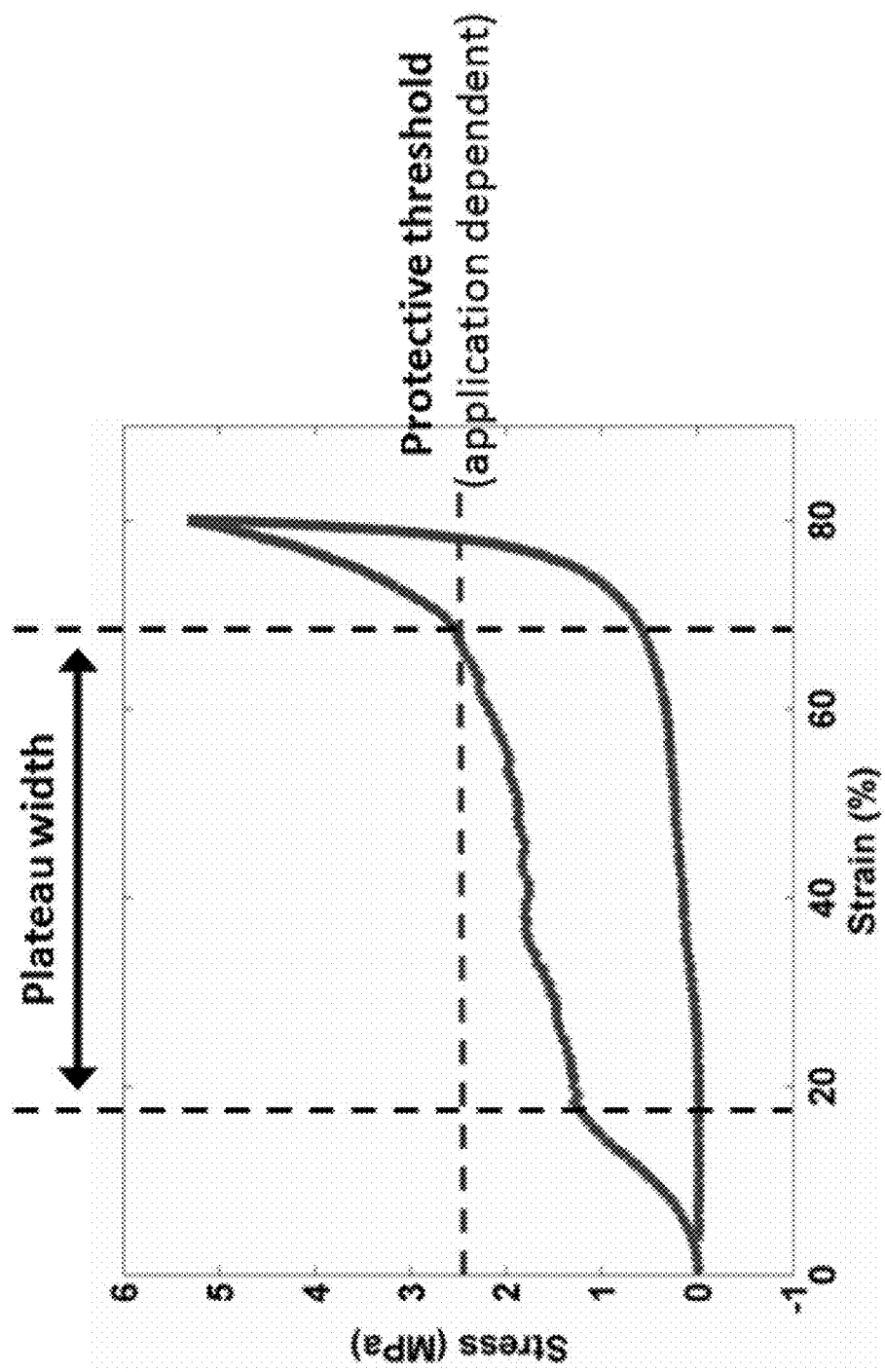
FIG. 2 shows a response of a CNT foam under compression, with three distinct regimes of deformation (divided by the two vertical lines).

Elastomeric open cell foams are usually constructed out of polymeric materials and exhibit a hysteretic, energy-dissipative response under compression (FIG. 2). In particular, FIG. 2 shows the response of a carbon nanotube (CNT) foam under compression, with three distinct regimes of deformation (divided by the two vertical lines) for use as a protective layer. The "protective threshold" determines the maximum pressure beyond which unacceptable damage will take place. Open cell foams are commonly used as lightweight protective layers for a variety of applications. As it has been studied in detail, these foams show three distinct regions of behavior when compressed. At small strains, the material can respond in a linear elastic fashion. For intermediate strains, the material can enter a plateau regime throughout which the stress increases a small amount with increasing strain. For large strains, the foam can transition to a densification regime in which stress can rise rapidly for small increases in strains. In practical applications, having a wide plateau can be useful, as it results in a large amount of energy dissipation prior to a dramatic rise in transmitted force (densification). It could be useful to know at what stress level the plateau is approximately located, as this is the force transmitted through the foam to the protected material underneath for most of the compression. Foams are therefore selected according to the protective threshold required by the application, with the plateau stress of the foam somewhere less than the threshold. Once densification occurs, the rapid rise in stress can quickly result in damage to whatever object is supposed to be protected by the foam.

The remarkable electrical, thermal, and mechanical properties of nominally aligned carbon nanotubes (CNTs), including possessing the lowest strength-to-weight ratio of any known material have received much attention as researchers have endeavored to obtain benefits at the macro scale level from these promising objects [see reference 5, incorporated herein by reference in its entirety]. To this end, it has been observed that aligned arrays of multiwall CNTs synthesized in certain ways behave similar to elastomeric open cell foams, with the same three-regime deformation behavior and recovery from large strains [see references 3 and 4, incorporated herein by reference in their entirety]. Moreover, in comparing the performance of this material to that of typical polymeric foams of comparable density (0.1-0.3 g cm$^{-3}$), it has been observed that the CNT foams dissipate at least 200 times the amount of energy in quasi-static compression tests conducted to 0.8 strain [see reference 1, incorporated herein by reference in its entirety]. Despite these promising characteristics, the typical CNT synthesis processes have resulted in enormous variability in the material properties, preventing their practical use.

Figure 1:
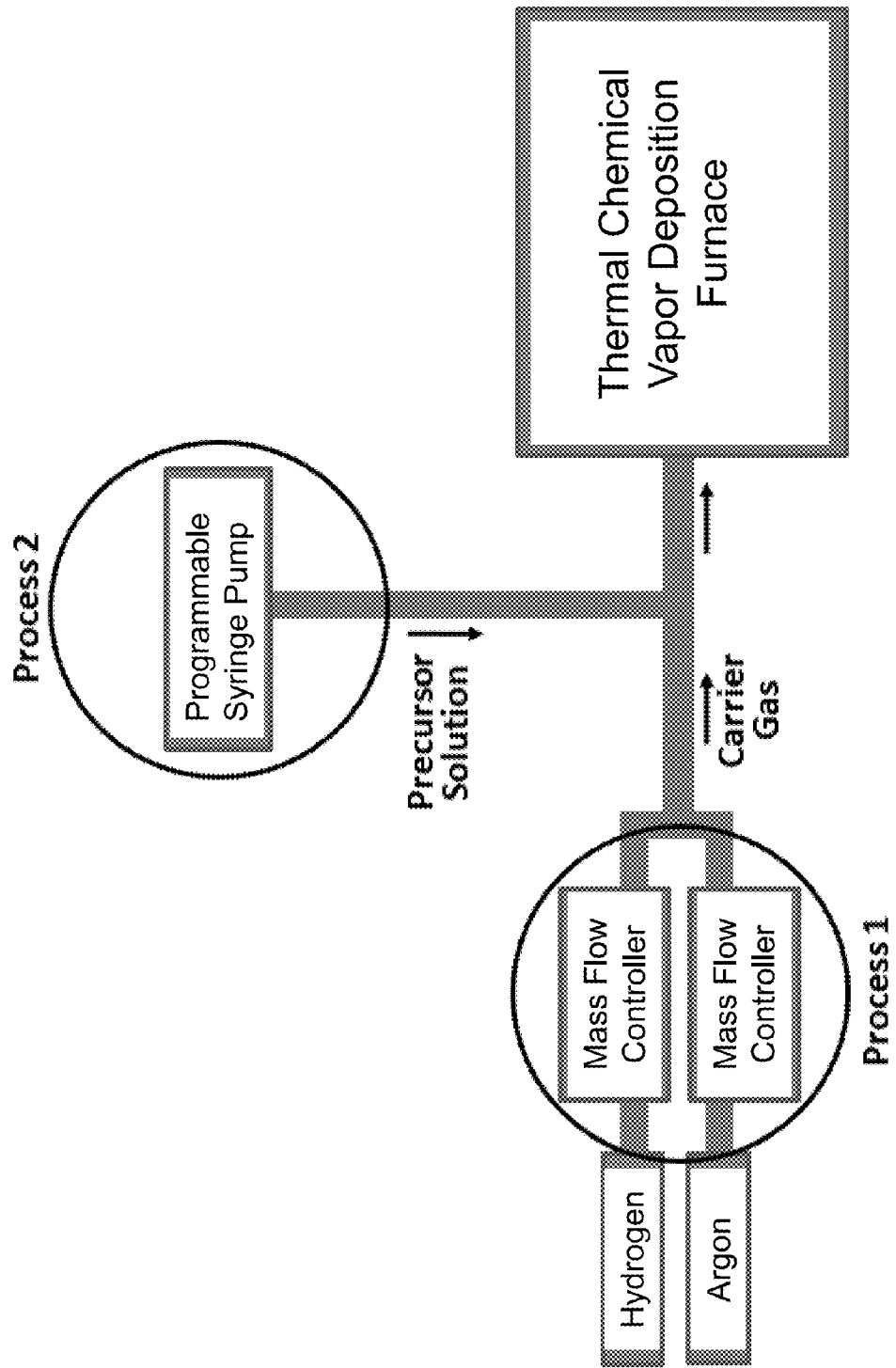
FIG. 1 shows a schematic of a CNT synthesis process according to some embodiments of the present disclosure.

According to some embodiments of the present disclosure, a process for synthesizing nominally-aligned arrays of carbon nanotubes (CNTs) is schematically shown in FIG. 1. More particularly, referring to FIG. 1, a floating catalyst thermal chemical vapor deposition (CVD) system that is used to synthesize foam-like arrays of CNTs can have a furnace (reaction zone), a precursor solution comprising a catalyst and a carbon source, and a carrier gas to move the solution into the reaction zone.

The synthesis of the CNTs can take place on a thermally oxidized Si surface placed inside the furnace prior to the reaction. According to some aspects of the present disclosure, this setup can have many variables that could affect the resulting CNT arrays, including flow rate and composition of carrier gas, flow rate and composition of precursor solution, and temperature.

In particular, according to some embodiments of the present disclosure, general processes to control the resulting material properties both at a microstructural level (e.g., the average CNT diameter) as well as the bulk level (e.g., the foam's stiffness and energy-dissipation properties) are provided. These processes enable reproducibility in the manufacturing process and customizability toward applications by the tuning of the foam's mechanical properties. The result of one of these processes is also a new foam-like material with a customizable heterogeneous microstructure resulting in improved impact protection.

More in particular, according to a first aspect of the present disclosure, method for synthesizing CNTs can include a first controlling phase wherein the hydrogen concentration can be regulated by the flow rates to uniformly control the microstructure and mechanical properties of the resulting CNT foam. This first controlling phase is designated in FIG. 1 by the circle labeled "Process 1".

A relationship between the quantity of hydrogen gas used in the method for synthesizing the foam and the resulting mechanical properties of the foam can be established. The hydrogen concentration can determine the microstructure of the foam, specifically the average CNT diameter. Higher hydrogen concentrations produce smaller CNT diameters, resulting in softer material. This mechanism can act to affect the microstructure uniformly. It follows that according to some aspects of the present disclosure, the first controlling phase can be based on the effect of using different hydrogen concentrations in the carrier gas.

In particular, controlling the amount of hydrogen during floating catalyst chemical vapor deposition of vertically aligned arrays of carbon nanotubes can have significant structural and mechanical effects. Using a lower hydrogen concentration in the furnace feedstock can lead to the growth of stiffer CNT arrays with higher average bulk density, less uniform diameter distribution, and larger average CNT diameters (e.g., due to the growth of individual CNTs with a larger number of walls). A lower hydrogen concentration can also lead to the synthesis of CNT arrays that can reach significantly higher peak stresses at maximum strain, and that can absorb increased amounts of energy during compression. Both the overall height of the arrays and their strain recovery after compression have been found to be independent of hydrogen concentration during growth. The stress-strain curves for samples synthesized without hydrogen do not present the clear three-regime deformation behavior characteristic of CNT foams, which can likely be a result of the non-uniformity of the associated CNTs. In contrast, samples synthesized with higher amounts of hydrogen better conform to the stress-strain behavior exhibited by ideal foams. This study shows that using different concentrations of hydrogen during synthesis allows for the tuning of microstructural properties of (vertically aligned CNTs) VACNTs, including the ability to control the distribution of CNT diameters and the number of CNT walls, and consequently their mechanical response. This contributes to an understanding of the tunability of CNT-based materials, at microstructural and bulk levels, and it is expected to facilitate the design of new materials with tunable mechanical properties for many potential applications, such as protective foams and novel laminar structural composites.

Figure 3A:
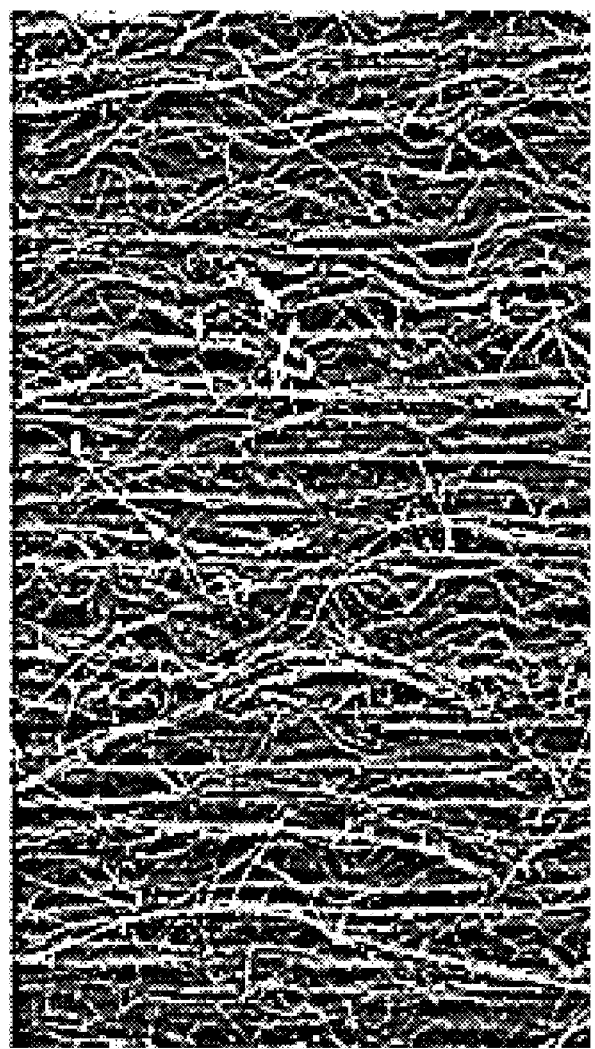
FIG. 3A shows a SEM image of an exemplary sample showing the substantially aligned nature of VACNTs as synthesized.
Figure 3B:
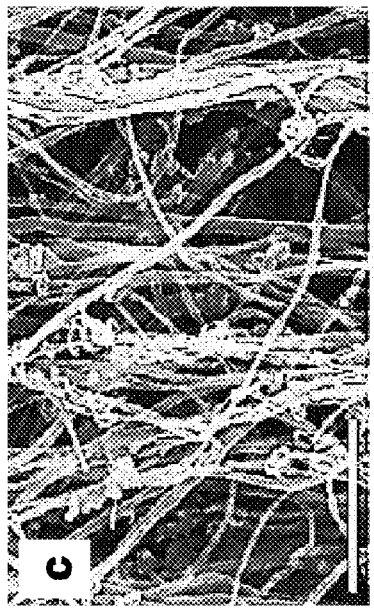
FIGS. 3B-3C show high resolution SEM images of CNTs grown without hydrogen and CNTs grown with 400 sccm (50%) hydrogen, respectively.
Figure 3D:
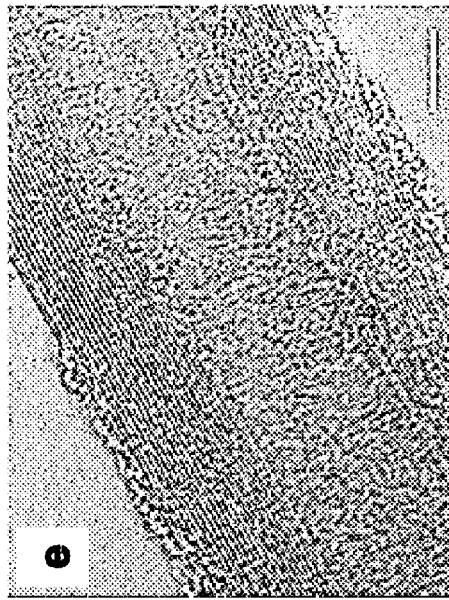
FIGS. 3D-3E show TEM images of characteristic CNTs synthesized with no hydrogen and with 400 sccm (50%) hydrogen, respectively.
Figure 3C:
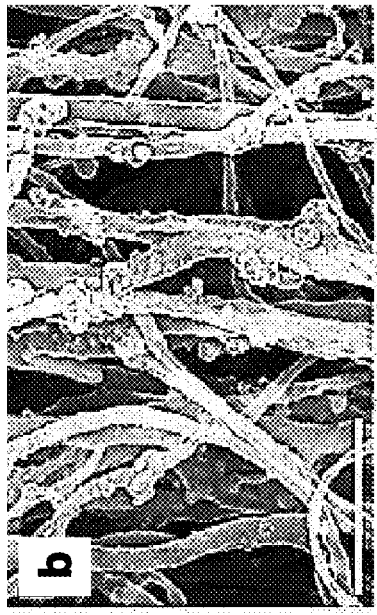
Figure 3E:
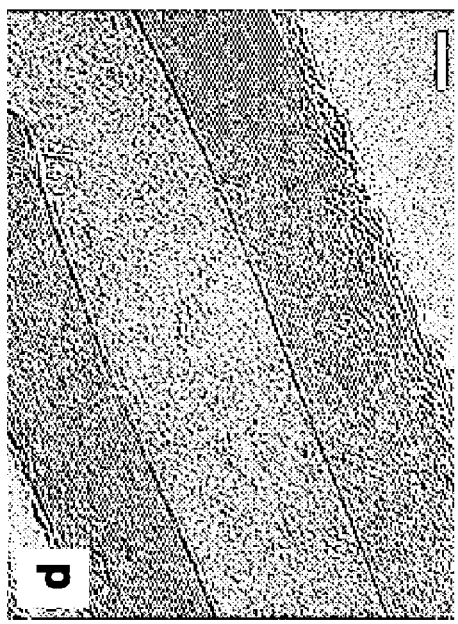

According to further embodiments of the present disclosure, the alteration of carrier gas can have a direct effect on the microstructure of the CNT array by changing the average CNT diameter as evident when using scanning electron microscopy (SEM) and transmission electron microscopy (TEM) as shown in FIGS. 3A-3E. In particular, FIG. 3A shows a SEM image of a typical sample showing the mostly-aligned nature of VACNTs as synthesized. The scale bar shown is 5 microns. FIGS. 3B-3C show high resolution SEM images of CNTs grown with no hydrogen and those grown with 400 sccm (50%) hydrogen, respectively. The scale bars shown are 500 nm. FIGS. 3D-3E show TEM images of characteristic CNTs synthesized with no hydrogen and with 400 sccm (50%) hydrogen, respectively. In FIGS. 3D-3E, the scale bars are 5 nm. Increasing hydrogen concentrations can result in CNTs with narrower average diameters due to having fewer walls. This can lead to a bulk material of lower bulk density (that can be seen in FIGS. 4A-4B), with bulk density being defined as the total mass over the total volume of the bulk material (including the empty pore space of the foams).

Figure 4A:
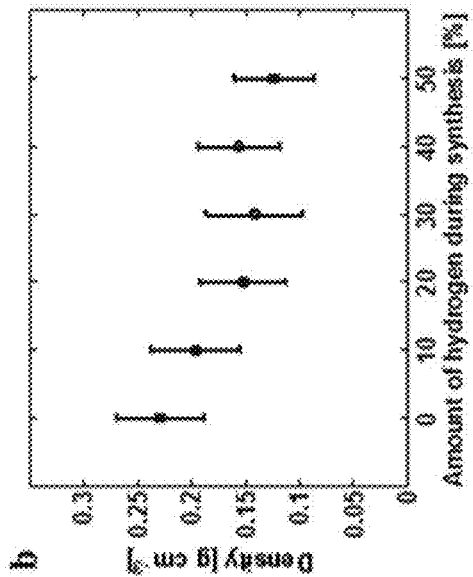
FIG. 4A shows an average CNT diameter for each hydrogen concentration tested, as measured with high resolution SEM.
Figure 4B:
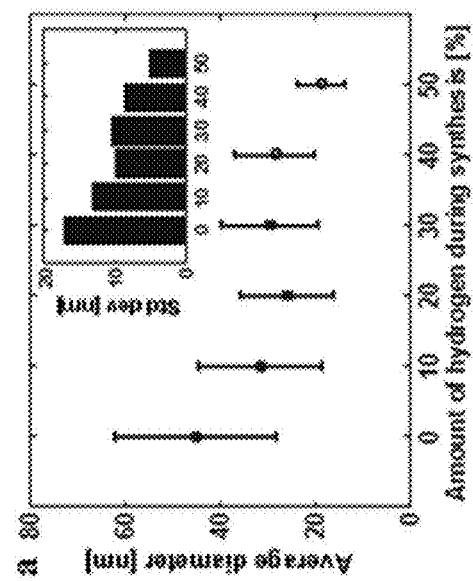
FIG. 4B shows an average bulk density of the CNT samples as a function of the hydrogen concentration.
Figures 5A, 5B:
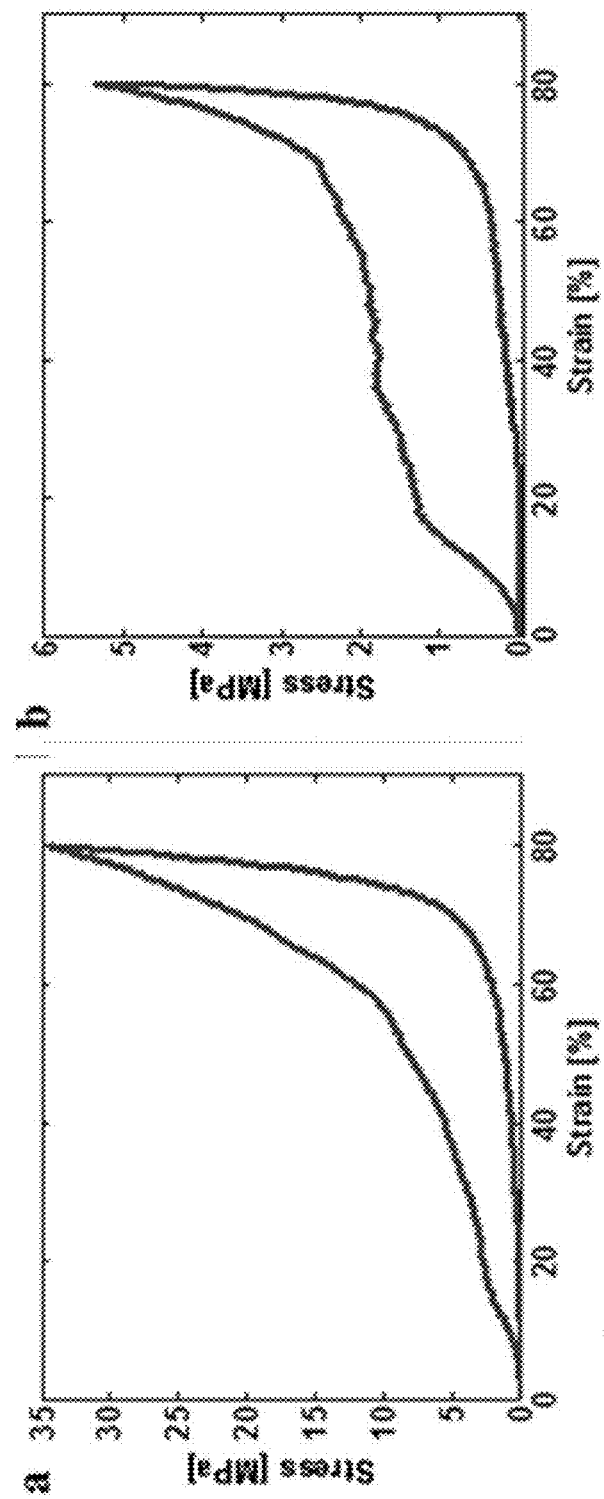
FIGS. 5A-5B show characteristic stress-strain curves obtained for a first cycle during quasistatic compression for the case without hydrogen and for the case with 50% hydrogen, respectively.

In particular, FIG. 4A shows an average CNT diameter for each hydrogen concentration tested, as measured with high resolution SEM. The standard deviations of the respective diameter distributions are shown in the inset to emphasize the narrowing of the diameter distributions for increasing amounts of hydrogen. FIG. 4B shows an average bulk density of the CNT samples as a function of the hydrogen concentration. This can result in a more compliant mechanical response (FIG. 5). In particular, FIGS. 5A-5B show characteristic stress-strain curves obtained for the first cycle during quasistatic compression for the case with no hydrogen and the case with 50% hydrogen, respectively. FIG. 5C shows the average energy absorbed per unit volume calculated for the first compressive cycle for each hydrogen concentration. The inset shows the variation of the peak stress values obtained at maximum (0.8) strain as a function of the hydrogen concentration used during growth. FIG. 5D shows the energy absorbed in the first compressive cycle plotted as a function of density for all concentrations of hydrogen. Comparing FIG. 5A and FIG. 5B show that the plateau stress decreases by at least a factor of 2 in going from 0 to 50% hydrogen, allowing for tailoring of the CNT foam according to the application. FIG. 5C shows that both the energy dissipation (e.g., "energy per unit volume" as calculated by finding the area within the hysteresis in the stress-strain curve) and the peak stress (e.g., maximum stress achieved at a given strain, in this case a strain of 0.8) decline for increased hydrogen concentrations. Using the data displayed in FIG. 5C, one can choose a carrier gas hydrogen concentration according to the desired mechanical response of the CNT array. As shown in FIG. 5D, there is a roughly linear dependence of energy dissipation on bulk density. A substantially similar linear dependence is also observed for peak stress as a function of bulk density. It follows that the carrier gas composition can be controlled to affect the microstructure uniformly, resulting in a tailored bulk mechanical response.

A detailed study of the first controlling phase is disclosed in [6] (Raney J R, et al. "Tailoring the microstructure and mechanical properties of arrays of aligned multiwall carbon nanotubes by utilizing different hydrogen concentrations during synthesis", Carbon 2011; 49: 3631-3638), the disclosure of which is incorporated by reference in its entirety in the present application and partially reported in the following paragraphs under the section "Example of the first controlling phase".

According to a second aspect of the present disclosure, a method for synthesizing CNTs can include a second controlling phase, wherein a syringe pump can control the injection rate of the liquid phase precursor solution and thereby controlling the heterogeneous density distribution of the material. This second controlling phase is designated in FIG. 1 by the circle labeled "Process 2". It follows that according to some aspects of the present disclosure, the second controlling phase can be based on the effect of varying the input rate of the precursor solution (e.g., ferrocene as catalyst dissolved in toluene as carbon source) during the synthesis process.

The second controlling phase allows one to introduce non-uniform structural changes in such foams. By varying the input rate of the carbon/catalyst solution during synthesis, softer, lower density regions can be formed along the height of the structure, which correspond to areas of lower average CNT diameters. Higher precursor input rates can result in the softer regions, and lower input rates can correspond to stiffer regions. In contrast to the first controlling phase, the second controlling phase therefore can affect the desired regions of the foam, resulting in the ability to construct a heterogeneous foam with stiffer or softer regions along the height where desired. In other words, the second process can tailor compressive strain localization along the height of an array and thereby improve impact energy dissipation through the introduction of micro scale heterogeneities during the synthesis process by variations in the input rate of catalyst and carbon precursors.

The result of the second controlling phase can be a new material with controllable soft regions. When the foam is compressed after synthesis, the softer regions are observed to buckle earlier than the rest of the foam, displaying strain localization. This effect can be used to create new lightweight foams with heterogeneous density distributions that improve the performance of the material under low velocity impact. This material can be further used as a thin protective layer designed to protect critical systems from low energy collisions.

In particular, the input rate of the catalyst solution, as controlled by the programmable syringe pump shown in the diagram in FIG. 1, can be altered during synthesis to result in a more targeted influence on the microstructure. For a typical synthesis process, it can be used as a constant injection rate between 0.8 and 1.0 ml min$^{-1}$, resulting in CNT diameters of approximately 40-50 nm. By using much higher input rates (e.g., 5 ml min-1), the precursor solution can be observed to boil at the entrance to the heating zone, providing both carbon and catalyst in excess. The result is a high rate of CNT growth, giving a softer region in the structure in which the average CNT diameter can be observed to be lower (~30 nm), as it can be determined statistically by high resolution SEM.

FIG. 6 shows an example of how the input rate of the precursor solution, as controlled by a programmable syringe pump, can affect the microstructure of the CNT foam. The input solution for synthesis of the CNTs consists of 0.02 g ml$^{-1}$ ferrocene in toluene, which can be applied at a constant rate, as shown in FIG. 6A, or at a variable rate, such as in FIG. 6B. The constant input rate displayed in FIG. 6A corresponds to the microstructure displayed via SEM in FIG. 6C (scale bar is 100 μm). The cyclic input rate represented in FIG. 6B corresponds to the microstructure displayed in FIG. 6D (scale bar is 200 μm).

Figure 6B:
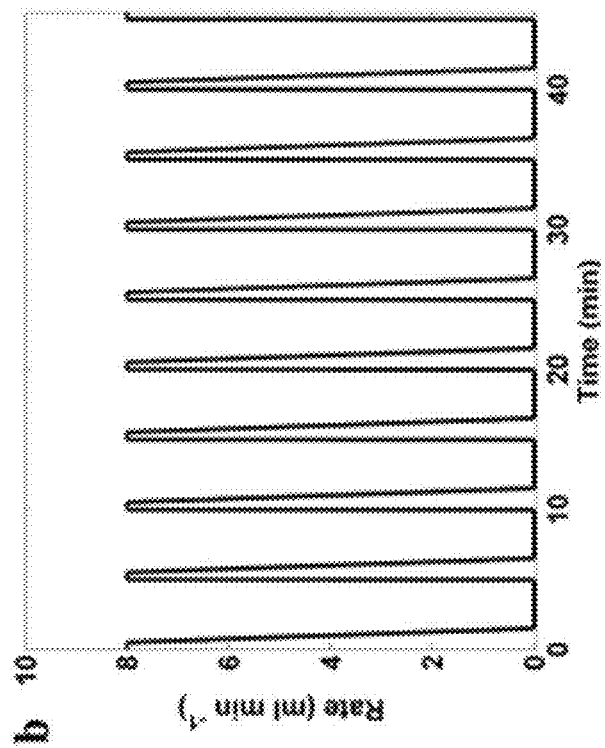
FIG. 6B shows a diagram representing variable rate of an input solution for synthesis of the CNTs.
Figure 6A:
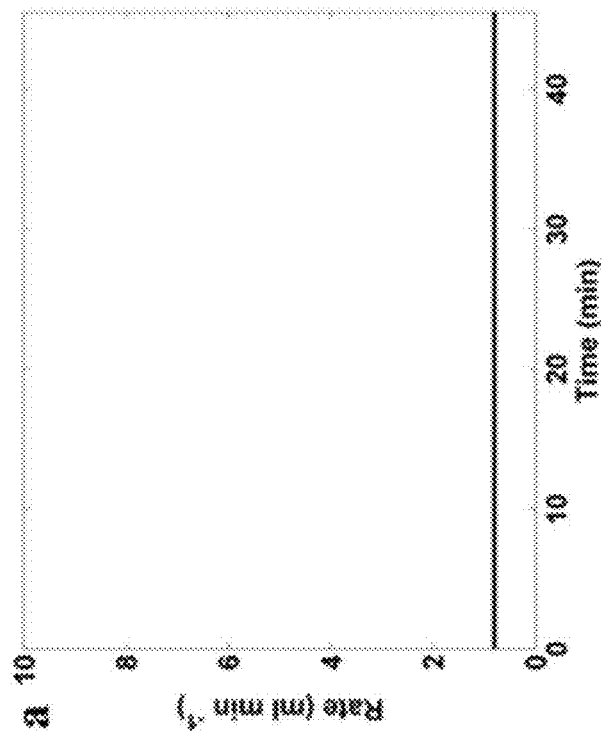
FIG. 6A shows a diagram representing constant rate of an input solution for synthesis of the CNTs.
Figure 6D:
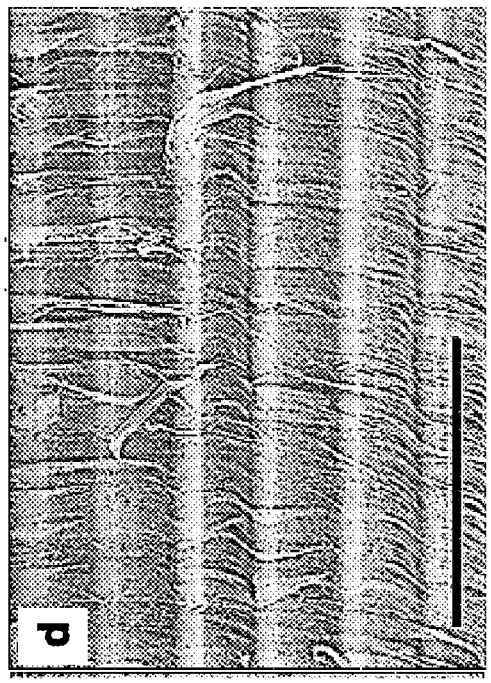
FIG. 6D shows a SEM image displaying a microstructure obtained by cyclic rate of input solution.
Figure 6C:
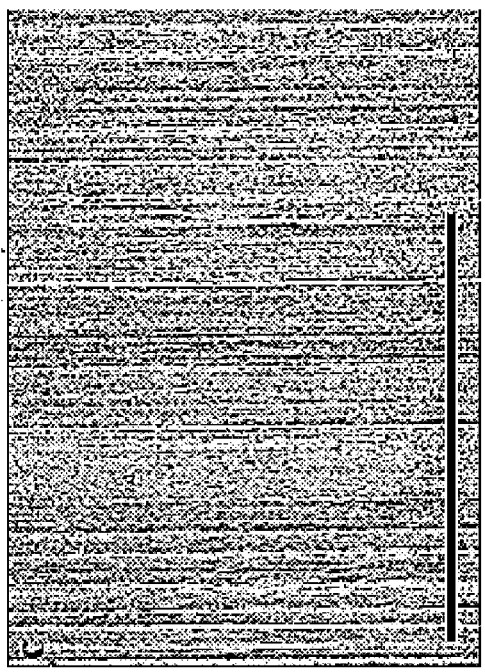
FIG. 6C shows a SEM image displaying a microstructure obtained by constant rate of input solution.
Figure 7B:
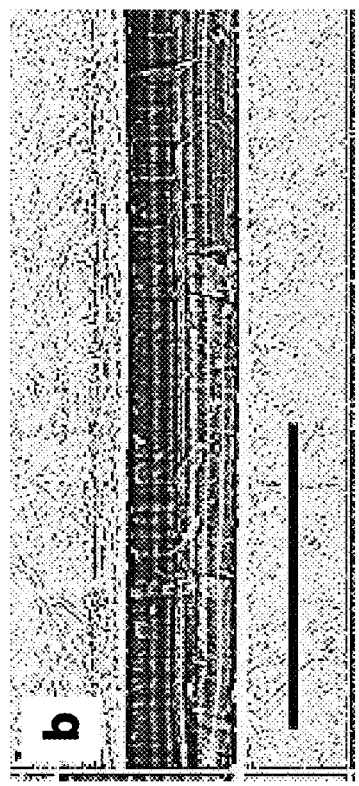
FIG. 7B shows a banded CNT structure in an uncompressed state.
Figure 7A:
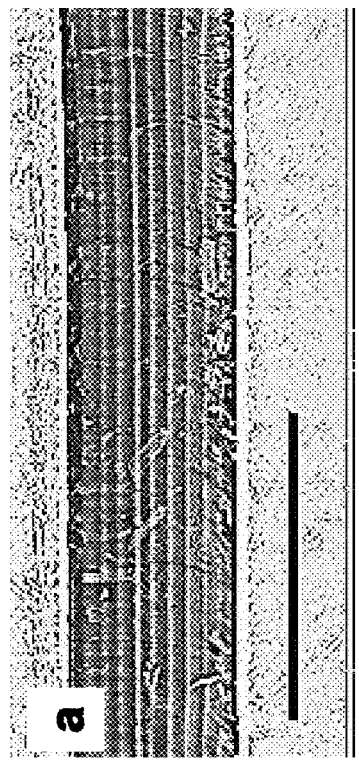
FIG. 7A shows a banded CNT structure in a steel vise in an uncompressed state.
Figure 7D:
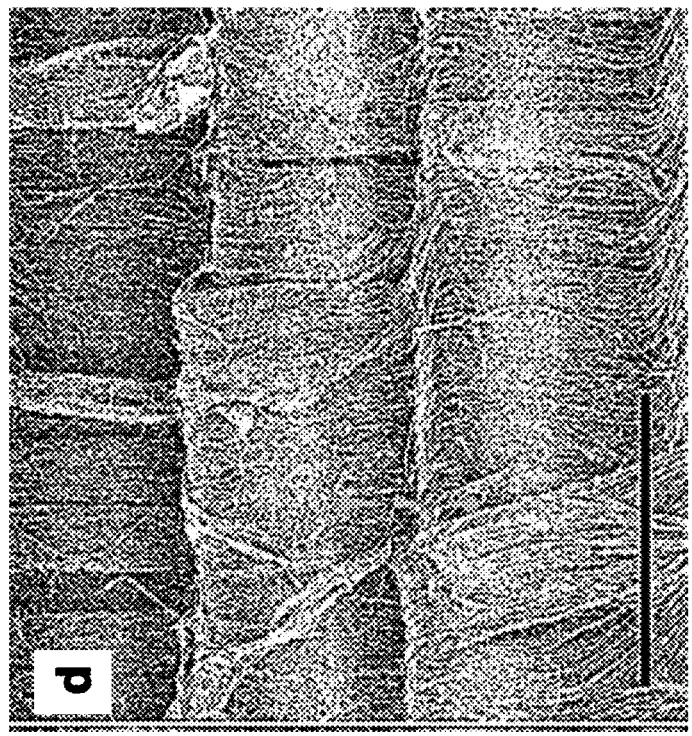
FIG. 7D shows a banded CNT structure, in an enlarged scale, in an uncompressed state.
Figure 7C:
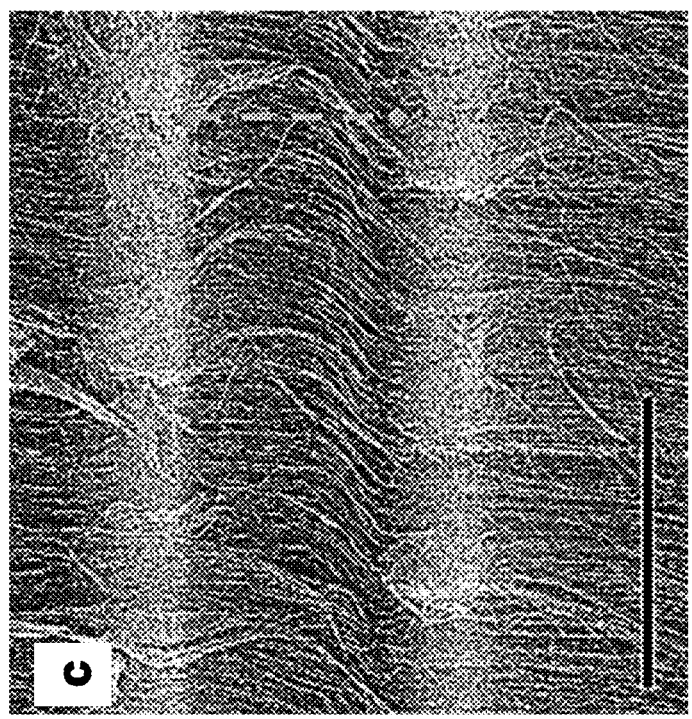
FIG. 7C shows a banded CNT structure, in an enlarged scale, in an uncompressed state.

In particular, FIG. 6A shows an example of a typical CNT synthesis method, and FIG. 6B shows an example of a method for synthesizing according to some embodiments of the present disclosure in which the input rate can be switched between very high and very low. As seen by SEM, the former results in the microstructure shown in FIG. 6C and the latter shown in FIG. 6D. Horizontal bands in CNT arrays similar to those in FIG. 6D have been observed before, and have been determined to be high density regions of lateral entanglement in which the typical CNT alignment has been disrupted, (see references [7], [8] incorporated herein by reference in their entirety). Such bands can have significant effects on the mechanical properties of the CNT foam. Since the CNT foams naturally rebound from compression, they were clamped and held using a steel vise to allow for SEM of the material in a compressed state. FIG. 7 shows SEM images for a CNT foam synthesized by the growth profile given in FIG. 6B. In particular, FIGS. 7A-7B show a banded CNT structure (as synthesized according to the input profile displayed in FIG. 1B) in a steel vise in uncompressed and compressed states, respectively (scale bars are 1 mm). FIGS. 7C-7D show the microstructure in the uncompressed and compressed state (scale bar is 50 μm) revealing how the buckling takes place predominantly in the darker, more aligned regions. The vertical dashed lines are visual aids for observing the strain localization taking place in the dark bands.

Comparing FIG. 7C and FIG. 7D, it is clear that when the CNT foam is under compression, buckling takes place in the softer more aligned regions corresponding to the higher precursor input rate. This fact can allow for control of strain localization such that a CNT foam can be constructed in a way to collapse in almost any desired location. The general scheme for synthesizing a CNT foam with one low density region is shown in FIGS. 8A-8B. In particular, FIG. 8A shows an input rate of the precursor feedstock as a function of time that is used for synthesis of a single "discrete" band, and FIG. 8B shows an input rate of the precursor feedstock as a function of time that is used for synthesis of a "continuous" band that does not have the same noticeably sharp boundaries.

More in particular, in FIG. 8A, regions I and III correspond to a normal precursor input rate of 0.8 ml min-1, while region II corresponds to a high precursor input rate that can result in a low density region. By changing the length of time given for region I relative to region III the location along the height at which the low density region (resulting from region II) ultimately ends up can be controlled.

Additionally, region II can be lengthened or shortened in order to increase or decrease, respectively, the thickness of the low density region. However, this does affect the mechanical properties which will be discussed later in the following paragraphs. FIG. 8A includes two regions of zero precursor input rate, between I/II and between II/III. This is referred to as the "discrete" case, since it results in sharp, visible boundaries between the low density region and the rest of the structure. Although optional, without such pauses, the transitions between the low density region and the surrounding CNTs can become too gradual to be observed easily. FIG. 8B corresponds to the latter case with no pauses and is referred to as the "continuous" case. It appears that the mechanical properties between the "discrete" and "continuous" cases are similar to each other, as it is described in the following paragraphs. Samples for such simpler cases of one low density region were synthesized and the materials were under impact. A ⅜ inch spherical steel striker was dropped from distances of 3-15 cm. Each drop event was recorded with a high speed camera to allow for measurements of the velocity of the striker before and after impacting the sample. From this data, the kinetic energy of the striker can be accurately computed before and after impact. Hence, using the principle of conservation of energy, the amount of energy dissipated during impact was determined (FIGS. 9A-9D).

Figures 9A, 9B:
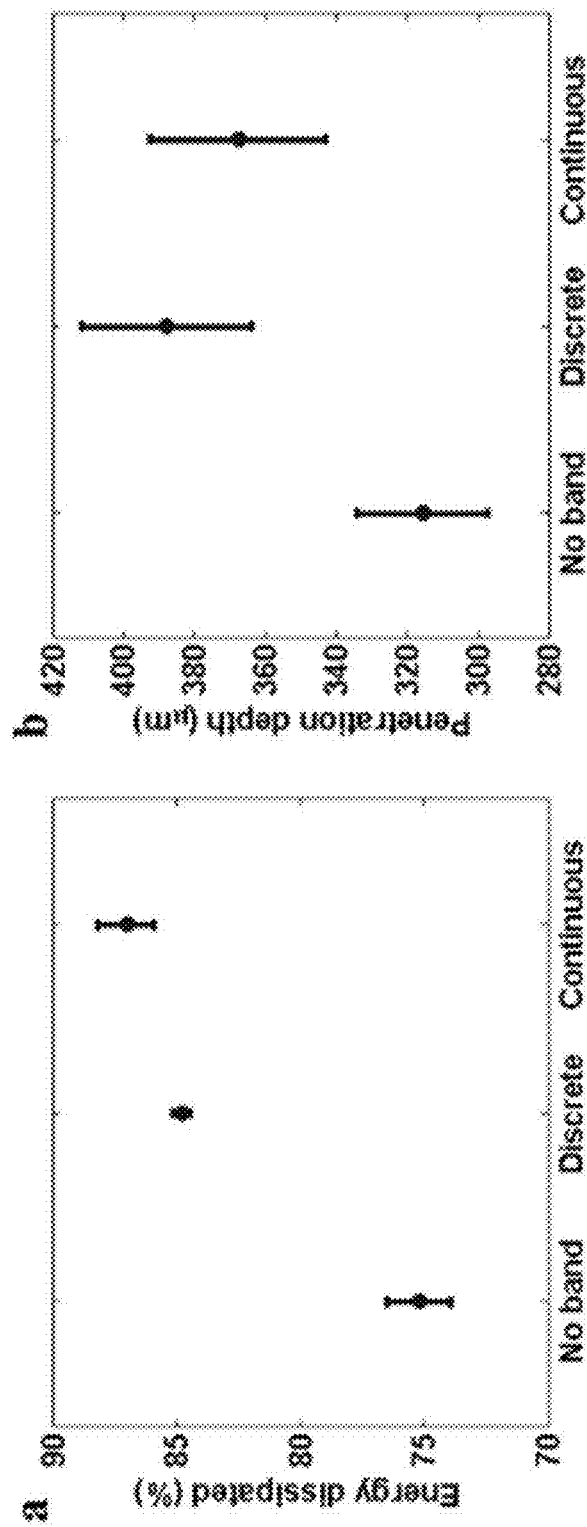
FIG. 9A shows an average energy of a striker that is dissipated during an impact test.
FIG. 9B shows an average penetration depth of the striker for the test and sample types as those of FIG. 9A.

In particular, FIG. 9A shows an average energy of the striker that is dissipated during an impact test (drop height 12.25 cm) for samples with no bands (the control case), one "discrete" band with sharp boundaries, and one "continuous" band with gradual boundaries. FIG. 9A shows the average penetration depth of the striker for the test and sample types.

Figure 9D:
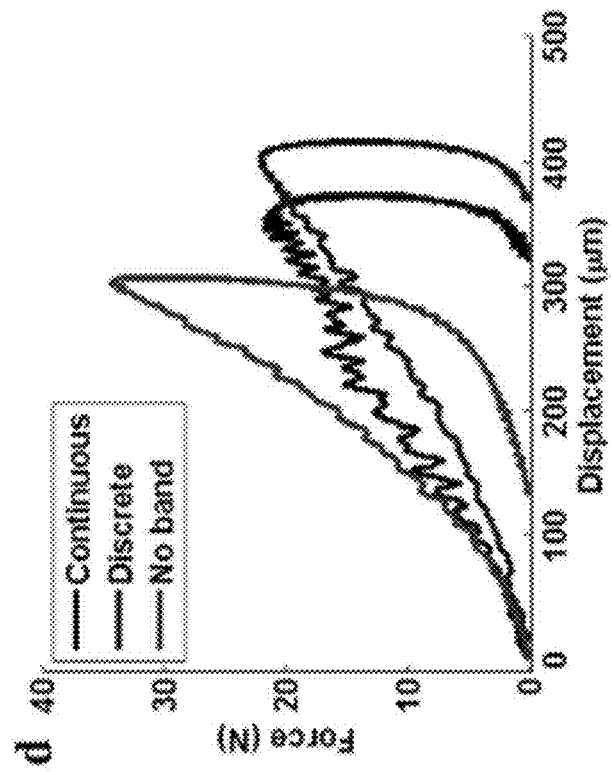
FIG. 9D shows representative force-displacement data for three sample types.
Figure 9C:
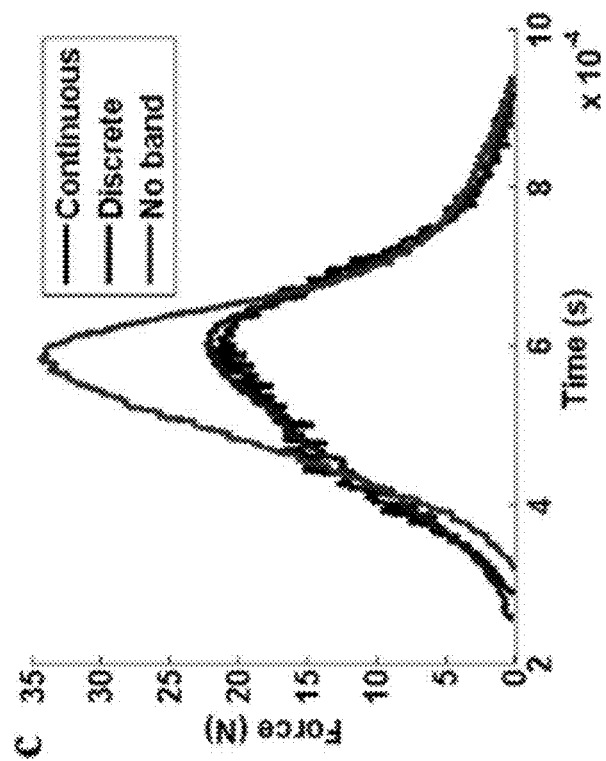
FIG. 9C shows representative force-time curves for three sample types.
Figure 10:
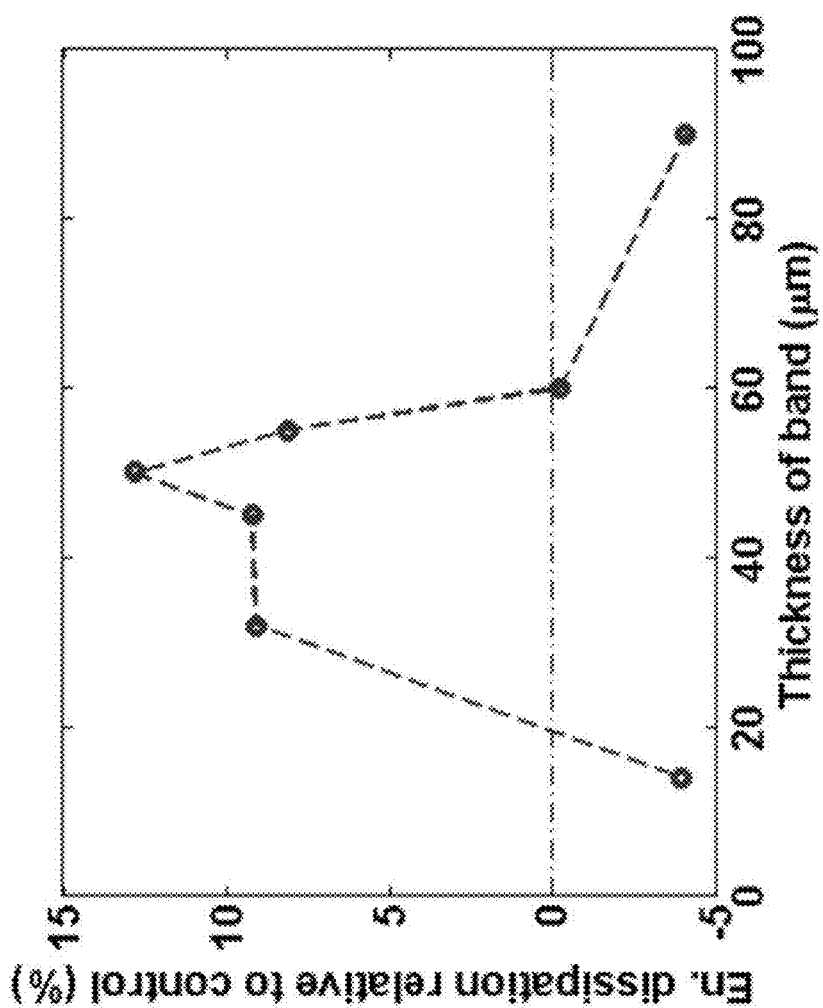
FIG. 10 shows a curve indicating a relationship between the thickness of the low density band and the energy dissipation of the structure under impact.

FIG. 9C shows representative force-time curves for three sample types. FIG. 9D shows representative force-displacement data for the same samples. During the collision, a force-time sensor underneath the sample recorded dynamic force as a function of time, and allowed for the calculation of penetration depth (FIG. 9B) and force as a function of displacement (FIG. 9D). From this data it is clear that a single low density band increases the energy dissipation of the striker impact by up to 20% over the control case (a sample with no bands). Much of this enhancement in energy dissipation appears to come from an increased penetration depth (FIG. 9B), allowing a given force to act over a longer distance and a longer time. This also results in a decreased peak force (FIGS. 9C-9D), subsequently decreasing the amount of stress experienced by an object behind the protective layer. The optimal thickness of the low density band was found to be between 30-55 μm (FIG. 10) for a drop height of 12.25 cm. In particular, FIG. 10 shows that the thickness of the low density band affects the energy dissipation of the structure under impact. The horizontal line at 0 indicates the average performance of samples with no bands. New CNT foam with low density bands of different thicknesses can be easily constructed by lengthening or shortening the amount of time for step II shown in FIG. 8A, if the desired application would involve striker energies different from those tested here.

A detailed study of the second controlling phase, and study of a resulting new foam-like heterogeneous material, is disclosed in Raney J R, et al. "Control of microstructural heterogeneities in arrays of aligned carbon nanotubes for tailored strain localization and improved impact energy dissipation", which is part of the U.S. provisional application 61/512,318 for "Carbon Nanotube Foams with Controllable Mechanical Properties" filed on Jul. 27, 2011, (mentioned above) and also described in the following paragraphs under section "Example of the second controlling phase".

According to a third aspect of the present disclosure, a method for synthesizing CNTs can include a third controlling phase which relates to a control on a position of CNTs sections on a growth substrate with respect of the carrier gas flow directions. In particular, CNT arrays grown in the substrate's sections closer to the gas inlet could have higher densities. A study on the effect of the carrier gas flow carrying the precursor on the structural and mechanical properties of vertically aligned CNT arrays, and on the effects of non-covalent functionalization of the CNT surfaces on the bulk mechanical response of the arrays in compression is disclosed in [22], Misra A, Raney J R, Craig A E, and Daraio C, *Nanotechnol.* 22, 425705 (2011), for "*Effect of density variation and non-covalent functionalization on the compressive behavior of carbon nanotube arrays*", the disclosure of which is also incorporated herein by reference in its entirety. An embodiment of the present disclosure relating to the third controlling phase is also described in the following paragraphs under section "Example of the third controlling phase".

According to further embodiments of the present disclosure, a method for synthesizing nominally-aligned arrays of carbon nanotubes (CNTs) and for controlling the mechanical properties of a foam structure of CNTs can include a combination of any one of the controlling phases of the group including the first controlling phase and/or the second controlling phase and/or the third controlling phase.

It can be noted each of the procedures outlined in the present disclosure and/or a combination of these procedures allow for one to tune the material over a wide variety of compressive responses, with the stress level of the plateau able to be altered by a factor of about 10. This means that these procedures could be used for a wide variety of applications over a comparable range of protective thresholds.

In addition, it can be noted that all of the procedures outlined above involve the tuning of parameters during CNT synthesis to alter the final structural and mechanical properties of the system. In combination with the first controlling phase and/or the second controlling phase and/or the third controlling phase, additional parameters can be utilized during CNT synthesis to tune the diameters of the CNTs. Because a relationship between average CNT diameter and the resulting bulk mechanical response of CNT arrays has been established, these other parameters are expected to have similar effects to those of the hydrogen concentration (i.e., the first controlling phase) and therefore can be combined with the first controlling phase or to the other controlling phases. For example, changing the temperature can affect the CNT diameters. Similarly, the concentration of catalysts can also affect CNT diameter, with more catalysts leading to larger CNT diameters, in general. It follows that these parameters are therefore an additional way in combination with the first controlling phase and/or the second controlling phase and/or the third controlling phase to tune the structure of the system, and thereby the mechanical response.

Example of the First Controlling Phase

Vertically aligned arrays of multiwall CNTs (VACNTs) were synthesized by floating catalyst thermal chemical vapor deposition at atmospheric pressure. The system utilized a long quartz furnace tube with a 4.1 cm internal diameter and a 15 cm heating zone. The temperature of the heating zone was 825° C. A thermally oxidized Si wafer was used as the substrate for CNT growth. A solution of ferrocene (the Fe catalyst precursor) and toluene (the carbon source) were mixed at a ratio of 0.02 g ml$^{-1}$. A total of 50 ml of this solution was injected into the furnace at ~1 ml min$^{-1}$. Synthesis cycles were performed with different quantities of hydrogen, varying from 0 to 400 sccm in 80 sccm increments (corresponding to concentrations from 0% to 50% of the total gas flow), with argon flow adjusted correspondingly from 800 to 400 sccm to maintain a total combined gas flow rate of 800 sccm. The amount of hydrogen used was fixed during each synthesis cycle. In other words, a carrier gas composition was therefore altered from 100% argon, 0% hydrogen to 50% argon, 50% hydrogen while keeping the total gas flow rate constant. The result of this process was arrays of VACNTs with total thickness (e.g., height along the CNT axis) of ~1 mm. The thick VACNT arrays were resilient against handling and could be physically manipulated. Prior to any mechanical testing, VACNTs on their growth substrate were sectioned into square areas of ~16 mm$^2$. The VACNTs were subsequently removed from the growth substrate, to which they were only weakly bonded, with a razor blade. The mass of each sample was measured with a microbalance. The sample height (along the long CNT axis) was determined using a commercial materials tester (INSTRON® E3000). A small preload of about 0.2 N (~0.12 MPa for the present samples) was used on all samples to ensure uniform contact. The apparatus measures displacement in 1 μm increments, resulting in an uncertainty of ~0.1% for the present samples (~1 mm thick). The volume of each sample was obtained by multiplying the sample height by the corresponding cross-sectional area. Bulk density was then calculated by dividing the mass by the corresponding volume of each sample. The average bulk density of samples grown with no hydrogen in the feedstock was 0.229 g cm$^{-3}$. However the bulk density was observed to vary with the sample's spatial position in the growth substrate. Higher densities were observed for CNTs grown on substrate areas closer to the entrance of the flowing gases, as reported in [22] and which is the subject of the third controlling phase.

Quasistatic cyclic axial compression was performed with the same apparatus (INSTRON® E3000), along the axis of the VACNTs. The stress-strain response was measured up to a set maximum compressive strain of 0.8 (chosen to avoid exceeding the force capacity of the apparatus), with a constant strain rate of 0.01 s$^{-1}$ for both loading and unloading.

Scanning electron microscopy (SEM) was conducted with a FEI Sirion at 15 kV on as-grown samples that had been removed from the growth substrate. Transmission electron microscopy (TEM) was performed using a FEI TF30UT at 300 kV. Samples were prepared for TEM by placing a small amount of the VACNTs into isopropyl alcohol and sonicating until the CNTs were dispersed. A small drop of this solution was placed on a TEM grid and the isopropyl alcohol was evaporated. Raman spectroscopy was performed with a RENISHAW® M1000 Micro Raman Spectrometer System using an Argon ion laser of wavelength 514.5 nm on samples removed from the substrate.

After completing synthesis of VACNTs using six different hydrogen concentrations (0-50% in 10% increments) the resulting samples were characterized by SEM and TEM, as shown in FIGS. 3A-3E. The SEM image in FIG. 3A shows the aligned nature of the CNTs as synthesized. SEM images at higher magnification for samples synthesized with no hydrogen (FIG. 3B) and maximum hydrogen (FIG. 3A) reveal a clear decline in the average diameter as the hydrogen concentration is increased. Likewise, TEM images in FIG. 3D and FIG. 3E display representative features of CNTs synthesized with no hydrogen and maximum hydrogen, respectively. It should be noted that the reduced number of walls present in CNTs produced with more hydrogen. It has been relied on high resolution SEM to statistically quantify variations in the CNT diameters. For consistency, it has been acquired images of the CNTs at the vertical midpoint of the growth area, to measure the CNT diameters from the same location in every sample. Results are shown in FIG. 4A. The standard deviation of the diameter distribution corresponding to a particular hydrogen concentration also drops significantly with increasing hydrogen concentration (inset of FIG. 4A). That is, a higher concentration of hydrogen during synthesis results in CNTs with a lower average diameter and an increased uniformity of diameters. This effect is in agreement with observations made in the case of floating catalyst synthesis of single-wall CNTs (see reference [10], incorporated herein by reference in its entirety).

At the macro scale level, the average height of the VACNTs does not change significantly with variations in the hydrogen concentration. However, their bulk density presents visible changes when the amount of hydrogen is varied in the feedstock (FIG. 4B). The average sample density for each hydrogen concentration was determined by taking the average bulk density over all samples grown on a substrate (about 20 samples for each hydrogen concentration). Variations in the mean sample densities are shown in FIG. 4B. It is evident that the decline in average CNT diameter that is observed for increased amounts of hydrogen in the synthesis process is reflected by a decrease of the average bulk density of the samples. Error bars in FIG. 4B are related to the variation in density that arises during growth in different areas of the substrate. SEM images were used to characterize the areal density of the CNTs (number of CNTs grown per unit area). The areal density increases with the use of a higher concentration of hydrogen during synthesis, verifying that the reduction of bulk densities is not simply a result of a decline in the number of CNTs. High-resolution transmission electron microscopy (HRTEM) analysis of the individual multi-wall tubes revealed that the core diameter (the diameter of the innermost wall), does not statistically change with hydrogen concentration.

Figure 4C:
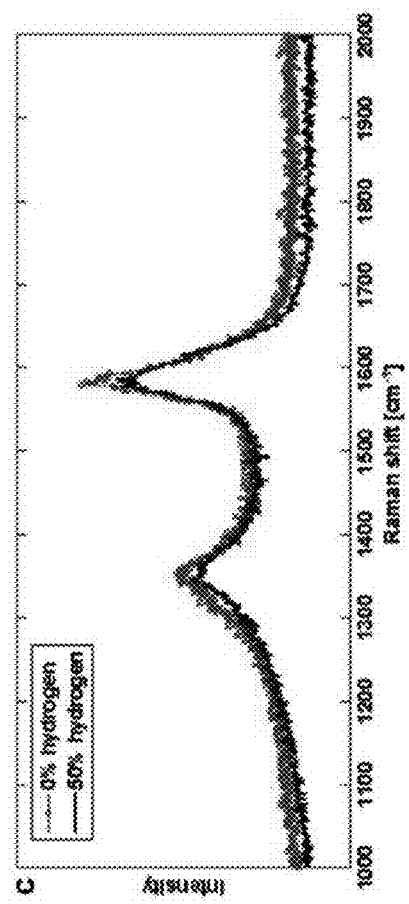
FIG. 4C shows Raman spectra for samples grown with 0% (top curve) and 50% hydrogen.

A similar effect was observed in studies of floating catalyst systems with other additives instead of hydrogen (see reference [5]), and also in studies of the effects of hydrogen in plasma-enhanced CVD systems [see reference [11], incorporated herein by reference in its entirety]. The decline in the CNTs' outer diameters, from an average of ~46 nm for 0% hydrogen to ~19 nm for 50% hydrogen, corresponds to a change in the number of walls from ~56 for 0% hydrogen to ~18 for 50% hydrogen. The observed trend in the decline of CNTs' diameters is in agreement with earlier reports for CNTs grown in a CVD system with a predeposited catalyst (see references [12], [13], [14], incorporated herein by reference in their entirety). It has been shown that introducing hydrogen into thermal CVD systems narrows Fe catalyst particles [12] and that this results in CNTs of smaller diameters (see again reference [12], and see references [15], [16], [17], incorporated herein by reference in their entirety). This effect was expected to be the primary reason why the present CNTs become narrower with increasing hydrogen concentration in the furnace. In order to rule out the possibility of hydrogen-induced etching as the cause of the observed smaller diameters, already-synthesized CNTs were placed back in the presence of hydrogen in synthesis conditions. Any perceptible etching or narrowing of the CNTs were not observed. Thus, the hydrogen can alter the CNT diameters when it is present during synthesis, affecting the catalyst. It was a concern that increasing hydrogen concentrations could cause defects in the CNT walls (see reference [18] incorporated herein by reference in its entirety). Raman spectroscopy measurements were performed to provide more quantitative information on the possible formation of defects induced by hydrogen (e.g., FIG. 4C). Results showed the presence of the typical peaks associated with Raman spectra of multi-wall CNTs. The D peak (the left peak in FIG. 4C) is associated with lattice defects and particle-size effects (see reference [19] incorporated herein by reference in its entirety). The G peak (the right peak in FIG. 4C) is associated with in-plane displacement of graphitic carbon (e.g., FIG. 4C) (see again reference [19]). The ratio of the intensity of these peaks is often used as an indicator of the quality of CNTs (e.g., see reference [20] incorporated herein by reference in its entirety). It was found, however, that changing the hydrogen concentration resulted in no significant changes in this ratio. It is likely that the many walls (e.g., 15-70) of the present CNTs make them resilient against the marginal etching effects of hydrogen (see reference [11]).

Quasistatic cyclic compression tests were performed to characterize variations in the mechanical properties of the VACNTs induced by the presence of hydrogen during the synthesis process (and by the related microstructural changes). All samples tested were of similar size and geometry, though it should be noted that VACNTs appear to exhibit compressive behavior that is independent of the geometry of the array (see reference [21] incorporated herein by reference in its entirety). Results for a loading and unloading cycle obtained from a sample grown with 0% hydrogen are shown in FIG. 5A and for a sample grown with 50% hydrogen in FIG. 5B. The stress-strain relationship for floating catalyst VACNTs under compression has been previously observed to exhibit a characteristic three-regime deformation behavior with hysteretic recovery (see reference [3]), similar to classical foams. This dissipative, hysteretic behavior is thought to be a result of friction that arises as the CNTs slide past one another (see reference [23], incorporated herein by reference in its entirety, and see reference [3]). The three deformation regimes correspond to: (i) an initial linear elastic region for small strains, (ii) a plateau region associated with buckling for intermediate strains, and (iii) a final "densification" stage for high strains (see reference [23]). The representative results reported in FIGS. 5A and 5B for the present samples show that an increased hydrogen concentration during synthesis results in a stress-strain relationship that more closely conforms to that expected for an ideal foam, with three distinct regions with different behaviors (see reference [24]), and a more distinct plateau region with lower peak stresses. This phenomenon has been related to the observed changes in the microstructure of the VACNTs, and particularly to the different diameter distribution associated with each hydrogen concentration. As shown in FIG. 2A and the inset therein, an increased amount of hydrogen during synthesis leads to the growth of VACNTs presenting a much narrower diameter distribution, and therefore a more uniform microstructure.

If the CNTs are approximated as Euler columns (as they can be when their length greatly exceeds their radius (see reference [9], incorporated herein by reference in its entirety)), their critical buckling stress can be expected to be proportional to the square of the radius. An array of Euler columns of different diameters will not buckle at a single stress value. As a consequence, CNTs that are synthesized with a large amount of hydrogen with small diameter variations within the array (e.g., a diameter distribution with a standard deviation of less than 5 nm for the 50% hydrogen case) should buckle more uniformly compared to those synthesized without hydrogen (e.g., with a much wider diameter distribution, with a standard deviation of 17 nm). This analysis is in qualitative agreement with the results displayed in FIG. 5A, where the stress-strain curve for the VACNTs grown with no hydrogen shows a progressive buckling behavior (e.g., an approximate plateau regime with a gradual increase of stress) over a broad stress range between 2 and 10 MPa. In contrast, VACNTs synthesized with 50% hydrogen (FIG. 5B) display a more uniform buckling behavior (e.g., a distinct plateau regime) over a much narrower stress range, between 1.3 and 2.5 MPa. It was observed that VACNTs synthesized at all hydrogen concentrations recover approximately the same amount of strain (about 0.1 residual strain after the first compressive cycle to a maximum strain of 0.8) for all samples, regardless of hydrogen concentration. The energy absorbed per unit volume by the VACNTs during a particular compressive cycle was calculated by integrating the area within the hysteresis loop in the stress-strain curve, and was compared among samples grown with different amounts of hydrogen. An increased amount of hydrogen during growth correlates not only with CNTs of narrower diameters but also with reduced energy absorption during compression. The decline in energy absorbed appears to reach a plateau level when the amount of hydrogen used during synthesis increases to 40-50%. The peak stress obtained at maximum strain, 0.8, follows the same trend. This decline in energy absorption and peak stress was attributed to the observed variation in the microstructural properties (e.g., the variation in the bulk density of the VACNT arrays and in the individual CNT diameters/number of walls). This decrease in peak stress and energy dissipation that occurs for the VACNTs synthesized with larger amounts of hydrogen matches the decreased diameters of the CNTs themselves and hence a decrease in the force they can bear rather than a decline in CNT quality, as noted in the Raman analysis.

As described earlier, the density of the VACNT arrays taken from a given substrate varies with position. Higher densities are measured for samples taken from areas of the growth substrate closer to the entrance of the gases in the furnace. For any given hydrogen concentration, the energy absorption of each VACNT array depends nearly linearly on this density variation. A similar relationship has been observed for VACNTs in the variation of peak stress with density (see reference [26]). However, it is interesting to note that two VACNT samples with the same bulk density, but synthesized with different concentrations of hydrogen, will typically absorb slightly different amounts of energy in compression, revealing that bulk density alone is not a sufficient predictor of mechanical properties. In other words, a separate linear relationship between bulk density and energy absorption exists for each hydrogen concentration utilized.

Example of the Second Controlling Phase

According to further aspects of the present disclosure, the process of synthesizing can include establishing a relation between an input rate of the catalyst solution and the diameter of the CNTs.

Specifically, millimeter-scale arrays of CNTs on thermally oxidized Si substrates can be synthesized using a floating catalyst CVD system in a flow of argon at 825° C. In contrast with fixed catalyst systems, in which a catalyst layer is deposited on the growth substrate prior to CNT synthesis, floating catalyst systems continuously input catalyst along with the carbon source. As reported in detail in reference [6], the disclosure of which is incorporated herein by reference in its entirety in the present disclosure, a solution of ferrocene has been used (Fe catalyst precursor) and toluene (carbon source). Non-constant input rates for the precursor solution has been used, controlled by a programmable syringe pump. When high injection rates (e.g., several ml min$^{-1}$) are used in bursts of a few minutes or less, it has been observed that a corresponding softer region results in the final CNT structure. Using high resolution scanning electron microscopy (SEM), it has been observed that the CNTs in these softer regions have a lower average diameter than the CNTs in regions synthesized with slower injection rates (e.g., ~30 nm for the former and ~43 nm for the latter), but statistically similar areal densities as estimated by a count of the number of CNTs per unit length across the structure. This may be related to the "lengthening-thickening" two stage growth process that CNTs have been previously observed to undergo (see reference [26]).

According to this understanding, in the initial stages of synthesis, CNTs lengthen rapidly but remain of narrow diameter. Later in the process, the diameter begins to rapidly increase, with the rate of lengthening concomitantly declining (see reference [26]). At the other extreme, the precursor input rate can be set to zero by pausing the injection system, depriving the heating zone simultaneously of any new carbon or catalyst. If the system is starved of precursor solution in this way, higher density regions of lateral entanglement (poor CNT alignment) arise (see references [7], [8]). An input rate profile corresponding to a particular CNT growth cycle is shown in FIG. 6A in which a typical constant input rate of 0.8 ml min$^{-1}$ is used, which is the normal growth or "control" case for the purposes of this work. In contrast, a variable input rate profile is shown in FIG. 6B, in which the input rate alternates between "excess" (e.g., 8 ml min$^{-1}$) and "starvation" (e.g., 0 ml min$^{-1}$). Scanning electron microscope (SEM) images corresponding to each case are shown in FIGS. 6C and 6D, respectively. It should be noted that the uniform, aligned arrangement of the former corresponds to the constant input rate, and the distinct horizontal bands of the latter correspond to an input rate varying between excess and starvation.

As is typical for arrays of CNTs synthesized using floating catalyst techniques (see references [3], [23], [6], and reference [27] incorporated herein by reference in its entirety), arrays synthesized with a constant input rate and those synthesized with varying input rates recover to most of their original height after large compressive strains. In order to observe the manner of collapse in the system under compression, a steel vise was used to hold the arrays in a compressed state to allow for SEM imaging. FIG. 7A shows an array corresponding to the input rate profile shown in FIG. 6B in the uncompressed steel vise. FIG. 7B shows the same CNT array compressed by the vise to approximately 0.35 strain. FIGS. 7C and 7D show higher resolution SEM images of the uncompressed and compressed states, respectively. It is evident from the changes in FIG. 7D relative to FIG. 7C that the compressive strain is predominantly localized in the dark bands. Comparing the height of the dark band in FIG. 7D to its height in FIG. 7C, as indicated by the vertical dashed lines, shows that the local strain in this particular dark band is about 0.42, which is about 20% higher than the global strain for the full CNT array of 0.35.

Additional samples were synthesized with different carbon/catalyst solution input rate profiles. For the simplest cases, samples were synthesized with only one of the low density "dark bands" described above. This was accomplished by using a three-part input rate profile using the programmable syringe pump. The three steps (I-III) are depicted in FIG. 8A: (I) a "normal" constant input rate of 0.8 ml min$^{-1}$ was used; (II) a higher constant input rate of 5 ml min$^{-1}$ was used in order to provide carbon/catalyst in excess (for two minutes in most cases); and (III) the same constant input rate as in step I (0.8 ml min$^{-1}$) was used. Two main categories of samples were synthesized. The first category of samples was synthesized with a pause in the precursor input rate between steps I/II and between steps II/III. These samples are referred to as the "discrete" band case because of the sharp boundaries that resulted between the low density band and the rest of the structure (see FIG. 8A). The other category of samples was synthesized with no pauses between the three steps and is therefore referred to as the "continuous" case due to the lack of sharp boundaries between the low density band and the rest of the structure (see FIG. 8B).

By changing the relative times for step I and step III (e.g., the "normal" synthesis rate before and after the low density band, respectively), the ultimate location of the low density region could be adjusted along the height of the CNT array. This allowed for the control of strain localization under compression.

Other input rate profiles were used to construct samples with multiple low density bands by repeating steps II and III in the above scheme multiple times, samples with low density bands of different thicknesses by varying the length of time for step II above, and samples with increased discreteness between low-density and normal-density regions by varying the amount of time that the input rate was paused between steps I/II and between steps II/III above. In addition to the quasistatic observations (e.g., the SEM images in FIG. 7A-7D), impact tests were performed in order to study the dynamic response. A steel sphere of ⅜ inch diameter having a mass of 3.47 g was dropped from heights of 3 to 15 cm onto samples synthesized using different feed rate profiles. All samples used for testing were approximately 1 mm in thickness and 0.28 g cm$^{-3}$ in bulk density.

Though samples of a wider range of heights (0.6-1.4 mm) and bulk densities (0.15-0.35 g cm$^{-3}$) were synthesized, only those samples near the desired height and density were used so that additional variables were not introduced. The testing apparatus was activated with a switch that simultaneously triggered a solenoid to release the striker and started a PHANTOM® high speed camera recording at 20 kHz. The falling striker was imaged by the camera before, during, and after impact, allowing the calculation of the striker's trajectory and the associated restitution coefficient (e.g., the ratio of the incoming and outgoing striker velocities). The apparatus includes a force sensor (e.g., PCB Piezotronics) underneath the sample, activated by the onset of dynamic force as a result of the striker's impact. This gives a force-time profile for each test. With the restitution coefficient readily calculated for each test using the images from the high speed camera, energy conservation principles allowed a value to be calculated for the amount of energy dissipated during each collision. The percent of incoming striker kinetic energy that was dissipated in each test was used as a figure of merit for the different types of samples. FIG. 9A compares the average amount of striker energy dissipated as a result of impact for "control" samples (e.g., constant precursor input rate of 0.8 ml/min), "discrete" samples (e.g., input profile given in FIG. 8a), and "continuous" samples (e.g., input profile given in FIG. 8B). Both types of modified samples dissipate significantly more energy than the control case and show only a small difference relative to one another.

Although FIG. 9A corresponds to impact events from drop heights of 12.25 cm, dependence was not seen on striker velocity within the margin of uncertainty of the present tests for the drop heights tested (e.g., from ~3 cm to ~15 cm), corresponding to impact velocities of 0.77-1.72 m s$^{-1}$ and approximate initial strain rates at a contact of $0.77\times10^{3-1}$-$1.72\times10^3$ s$^{-1}$. The low density regions act to improve impact energy dissipation in multiple ways. First, the low density bands result in larger displacement during contact. This is illustrated in FIG. 9B, where the average penetration depth of the spherical striker into the sample is given for each sample type. The penetration depth was calculated using the force-time data from the piezo sensor (e.g., FIG. 9C) and the Newtonian equations of motion for the striker.

The data for force as a function of time is approximated as the instantaneous force on the impacting sphere, ignoring the effects of stress-wave propagation as a first order approximation. Striker velocity as a function of time is determined by integrating this data in Newton's second law, using the incoming velocity of the striker as determined by the high speed camera as the integration constant corresponding to the initial velocity. Finally, this is integrated once more to obtain displacement as a function of time, with the initial position (onset of force) defined as zero position. The striker displacement into the samples is ~20-30% higher for the samples with bands than for those without bands (FIG. 9B). The increase in displacement means that the force during impact acts over a longer distance, with a larger portion of the structure deforming and thereby dissipating energy. This has been shown to be one of the causes of energy dissipation in other structures with variations in density, such as functionally-graded honeycombs (see reference [28], incorporated herein by reference in its entirety).

A second contribution to energy dissipation that results from the low density bands is an increase in permanent deformation in samples containing them. Control samples without these bands show less damage after impact. This was confirmed with SEM imaging after the impact tests. It was also confirmed by repeated impact events in the same location for each sample, which revealed that after the first one or two impact events, the sample performance quickly declines as defined by decreased energy dissipation and increased peak force, thus becoming approximately the same as the control samples. It is important to note that this compaction is highly localized. If the striker impacts a portion of the sample even a couple millimeters from a previous impact site then dissipation proceeds as if the sample had not been impacted previously.

The softer region appears to become somewhat compacted, losing its benefit after a few strikes. Accordingly, the trend for energy dissipation (FIG. 9A) closely matches that for penetration depth (FIG. 9B). FIG. 9D plots representative force-displacement curves for the different types of samples, revealing that the enhanced energy dissipation for the banded samples corresponds to lower peak forces, which can be a significant metric for protecting objects behind a foam layer from impact and higher displacements.

In addition to the effect on impact energy dissipation that arises from increased striker displacement and sample permanent deformation, a third effect due to resulting changes in stress wave propagation was also expected from the bands. It has been observed in other systems with layers of varying densities that these can greatly affect stress-wave propagation in high (e.g., blast loading) (see reference [29], incorporated herein by reference in its entirety) and moderate (low kinetic energy impact tests such as the tests of the present disclosure) (see reference [30], incorporated herein by reference in its entirety) strain rate conditions. Depending on how the stress wave amplitude compares to the local yield stress, the variations in density can result in changes to both the shape of the stress wave as well as the net energy dissipated (see reference [31], incorporated herein by reference in its entirety).

Other groups have synthesized banded CNT arrays by starting and stopping the injection of the solution of carbon source and catalyst. This may be a factor in the present systems but it requires further study to understand its relative importance, as little has been reported regarding stress wave propagation in aligned CNTs (see reference [32], incorporated herein by reference in its entirety) or by dropwise synthesis (see reference [32], and reference [33] incorporated herein by reference in its entirety). With both approaches, however, the layers were found to separate easily [32].

In the present case, it was found that there is much better continuity and adhesion between layers (similar to a study for a fixed catalyst system in which acetylene gas was used as a pulsed carbon source to synthesize sub-micron size bands (see reference [24], incorporated herein by reference in its entirety)) for both the present "discrete" and "continuous" cases. This was quantified by testing the samples in tension. Two factors are likely to promote improved continuity and adhesion even in the present "discrete" case. First, rather than abruptly shutting off the injection of precursor solution, some residual evaporation of precursor continues for roughly half a minute due to the buildup of a small pool of precursor in the present system directly in front of the heating zone of the furnace. Second, rather than pausing the system for 10-15 minutes (see references [8], [32]) or even longer (see reference [25], incorporated herein by reference in its entirety), the precursor flow has been kept off for a few minutes at a time. If the input of the precursors completely stopped for more than 10-15 minutes, then the layers readily separated even with light handling. Thus, the continuity of the CNTs between layers and, as a result, the interlayer strength appears to depend on the time that the structure is deprived of precursor solution.

Since mechanical performance such as dissipation of impact energy was actually superior in the "continuous" case relative to the "discrete" case, there is little reason to not synthesize samples of the "continuous" type, which, with their more gradual boundaries between layers would be expected to have even better interlayer adhesion. It has been also studied how the height of the band affects the mechanical performance by changing the amount of time during synthesis that the high input rate of precursor solution was used. The resulting samples were tested under impact, and the band sizes were determined using SEM. All samples were of "discrete" type in order to facilitate accurate measurement of band height. The results are shown in FIG. 10. For very short or very thick bands, the performance of the samples under impact actually becomes worse than the control case. The best performance is found for bands in the 30-55 μm range. It has been expected that this optimal band size would vary if strain rate changed significantly since the density profile for optimal energy dissipation changes with the amplitude of the stress wave. The precursor flow has been kept off for only a few minutes at a time. If the input of the precursors completely stopped for more than 10-15 minutes, then the layers readily separated even with light handling. Thus, the continuity of the CNTs between layers, and as a result, the interlayer strength appears to depend on the time that the structure is deprived of precursor solution.

Moreover, since mechanical performance such as dissipation of impact energy was actually superior in the "continuous" case relative to the "discrete" case, there is little reason to not synthesize samples of the "continuous" type, which with their more gradual boundaries between layers would be expected to have even better interlayer adhesion (see reference [31]). It is also worth noting that some samples of the "continuous" type performed better than the maximum performance shown in FIG. 10 by dissipating up to 20% more energy than the control case.

By varying the input rate of the precursor solution (containing both the carbon source and the catalyst precursor necessary for CNT synthesis) into a CVD furnace, CNT arrays can be synthesized with a heterogeneous structure. Higher precursor input rates lead to softer regions with lower average CNT diameter, which are observed to buckle earlier than higher density regions when the structure is subject to compression. As a result, strain can be controllably localized in a compressed CNT array.

Example of the Third Controlling Phase

Figure 11A:
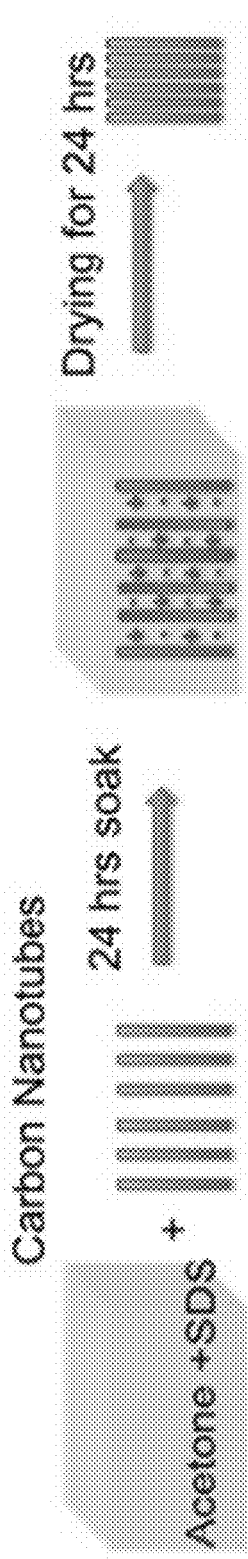
FIG. 11A shows a schematic diagram of a wetting process of CNT, where freestanding carbon nanotubes are first soaked in the acetone/surfactant solution, and then dried.
Figure 11B:
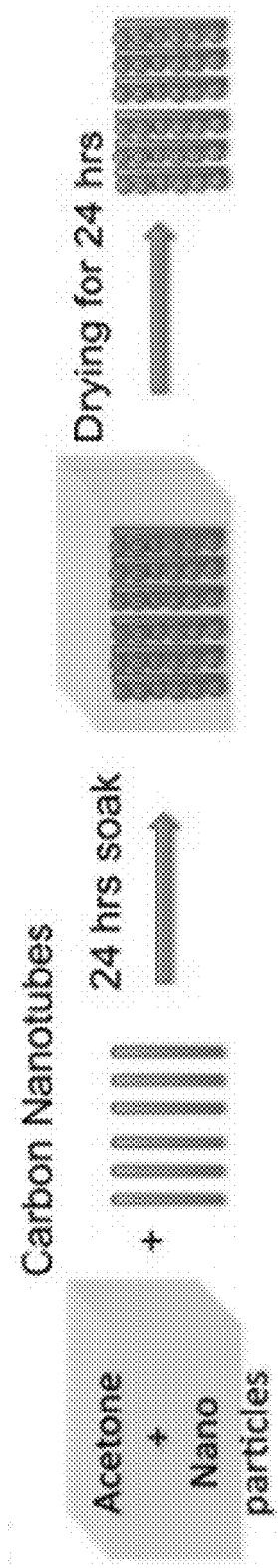
FIG. 11B shows a schematic diagram of a wetting process of CNT, where freestanding carbon nanotubes are soaked in a solution of acetone and nanoparticles.

Vertically aligned arrays of carbon nanotubes were grown using a floating catalyst TCVD method. The microstructure of the resulting arrays was highly hierarchical: at the mesoscale, CNT bundles grew vertically away from the substrates; at the micro-scale (within these bundles), the individual CNTs grew highly entangled with their neighbors. The TCVD system used included a single furnace utilizing a quartz tube through which the precursor vapors passed into the heating zone. Source precursors (0.02 g ferrocene per milliliter of toluene) were fed directly into the quartz tube before entering the heating zone. The growth substrates consisted of silicon wafers with a 1 µm thick thermal oxide layer (area ~3×2 cm$^2$), and were placed at the center of a high temperature (825° C.) zone in the furnace. After the growth was completed, small sections of the CNT arrays (~7×7 mm$^2$) were separated from the substrates using a razor blade, to obtain freestanding samples for the testing. The bulk densities of the freestanding samples were calculated by dividing the measured mass of each sample by its measured volume. The density of the CNT samples was found to vary between 0.12 and 0.28 g cm$^{-3}$, depending on the position of the CNT sections on the growth substrate with respect to the carrier gas flow direction (CNT arrays grown in the substrate's sections closer to the gas inlet had higher densities). The CNT arrays were functionalized by two methods: in the first one, the CNT arrays were first separated from the growth substrate and then they were wetted in 15 ml of volatile acetone containing 0.02 g of dispersed silica nanoparticles (with diameters ~10-20 nm); in the second one, the CNT arrays were also first separated from the growth substrate and then they were immersed in acetone containing sodium dodecyl sulfate (SDS) instead of the silica (SiO$_2$) particles. The solutions containing acetone and nanoparticles or surfactant were ultrasonicated for 30 min to obtain uniform dispersions. The freestanding CNT samples were soaked in the ultrasonicated solutions for 24 h and they were dried for the next 24 h. The schematic diagrams in FIGS. 11A and 11B describe the wetting processes of CNTs in acetone with dispersed SDS and SiO$_2$ nanoparticles, respectively.

Figure 12:
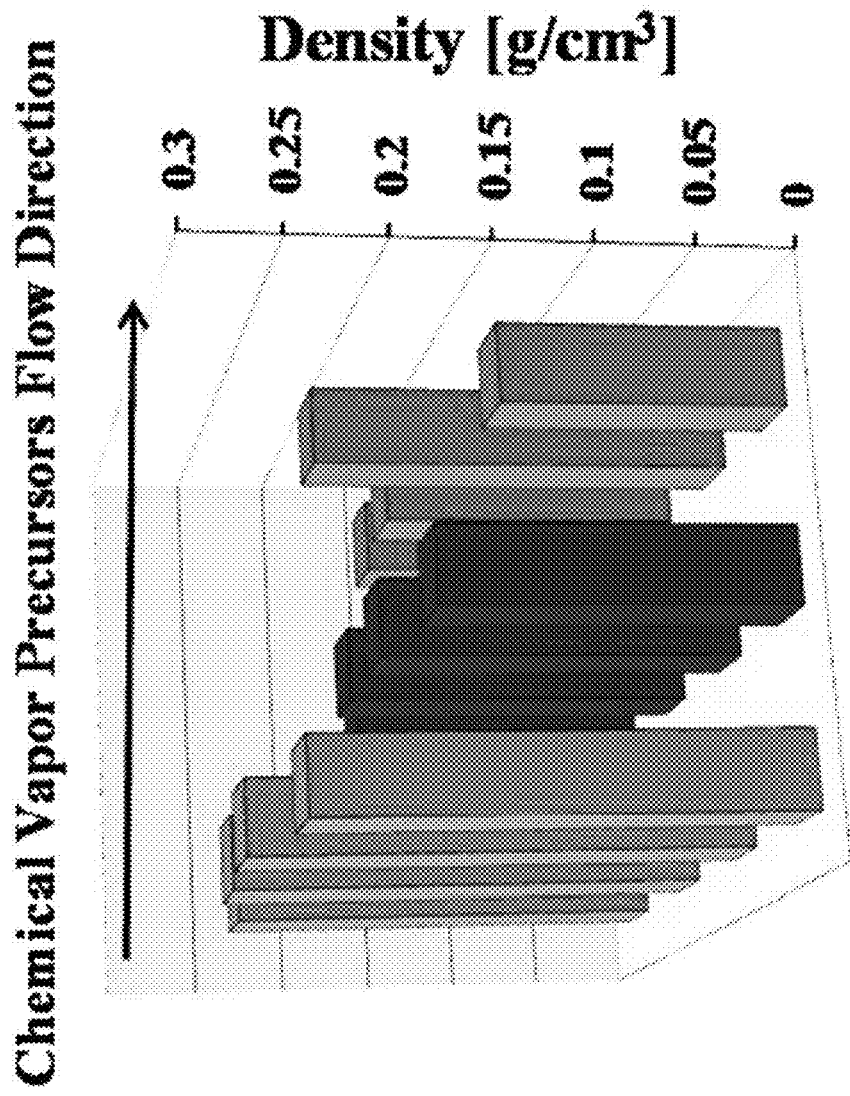
FIG. 12 shows density variation of as-grown carbon nanotubes as a function of the position on the substrate, where an arrow on top indicates the direction of the chemical precursors' flow.

With reference to FIG. 12, the samples obtained by the wetting processes can be studied to measure the density gradient in the as-grown CNT arrays as a function of the position on the growth substrate. In particular, in FIG. 12, an arrow indicates the direction of the gas flow inside the chamber with respect to the substrate position. From the diagram, it is evident that the as-grown CNTs' density is higher in the substrate regions closer to the gas flow input, and it decreases gradually as the CNTs grow farther from the flow input.

Example of a Fourth Controlling Phase

An example of a fourth controlling phase includes a combination of any one of the examples of the first controlling phase and/or the second controlling phase and/or the third controlling phase disclosed in the paragraphs reported above.

The examples set forth above are provided to give those of ordinary skill in the art a complete disclosure and description of how to make and use the embodiments of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

LIST OF CITED REFERENCES

[1] Misra A, et al. "Synthesis and characterization of carbon nanotube-polymer multilayer structures", ACS Nano 2011; 5(10):7713-7721.

[2] Baughman R H, et al. Carbon nanotubes: the route toward applications, Science 2002; 297(5582):787-92.

[3] Cao A Y, et al. Super-compressible foam like carbon nanotube films, Science 2005; 310(5752):1307-10.

[4] U.S. Pat. No. 7,727,624.

[5] Maghrebi M, Khodadadi A A, Mortazavi Y, Sane A, Rahimi M, Shirazi Y, et al. Acetic acid effects on enhancement of growth rate and reduction of amorphous carbon deposition on CNT arrays along a growth window in a floating catalyst reactor. Applied Physics A: Materials Science & Processing 2009; 97(2):417-24.

[6] Raney J R, et al. "Tailoring the microstructure and mechanical properties of arrays of aligned multiwall carbon nanotubes by utilizing different hydrogen concentrations during synthesis", Carbon 2011; 49:3631-3638.

[7] Jackson J J, et al. Pulsed Growth of Vertically Aligned Nanotube Arrays with Variable Density, ACS Nano 2010; 4:7573-7581.

[8] Pinault M, et al. Evidence of Sequential Lift in Growth of Aligned Multiwalled Carbon Nanotube Multilayers, Nano Letters 2005; 5:2394-2398.

[9] Wang C M, Zhang Y Y, Xiang Y, Reddy J N. Recent studies on buckling of carbon nanotubes. Applied Mechanics Reviews 2010; 63(3):030804.

[10] Liu Q, Ren W, Chen Z, Wang D, Liu B, Yu B, et al. Diameterselective growth of single-walled carbon nanotubes with high quality by floating catalyst method. ACS Nano 2008; 2(8): 1722-8.

[11] Okita A, Suda Y, Oda A, Nakamura J, Ozeki A, Bhattacharyya K, et al. Effects of hydrogen on carbon nanotube formation in CH4/H2 plasmas. Carbon 2007; 45(7):1518-26.

[12] Nessim G D, Hart A J, Kim J S, Acquaviva D, Oh J, Morgan C D, et al. Tuning of vertically-aligned carbon nanotube diameter and areal density through catalyst pre-treatment. Nano Letters 2008; 8(11):3587-93.

[13] Aksak M, Selamet Y. Carbon nanotube diameter tuning using hydrogen amount and temperature on SiO2/Si substrates. Applied Physics A: Materials Science & Processing 2010; 100(1):213-22.

[14] Dong L, Jiao J, Foxley S, Tuggle D W, Mosher C L, Grathoff G H. Effects of hydrogen on the formation of aligned carbon nanotubes by chemical vapor deposition. Journal of Nanoscience and Nanotechnology 2002; 2(2): 155-60.

[15] Abbaslou R M M, Soltan J, Dalai A K. The effects of carbon concentration in the precursor gas on the quality and quantity of carbon nanotubes synthesized by CVD method. Applied Catalysis A: General 2010; 372(2):147-52.

[16] Li Y, Kim W, Zhang Y, Rolandi M, Wang D, Dai H. Growth of single-walled carbon nanotubes from discrete catalytic nanoparticles of various sizes. Journal of Physical Chemistry B 2001; 105(46):11424-31.

[17] Romo-Negreira A, Cott D J, De Gendt S, Maex K, Heyns M M, Vereecken P M. Electrochemical tailoring of catalyst nanoparticles for CNT spatial-dimension control. Journal of The Electrochemical Society 2010; 157(3): K47-51.

[18] Zhang G, Mann D, Zhang L, Javey A, Li Y, Yenilmez E, et al. Ultra-high-yield growth of vertical single-walled carbon nanotubes: hidden roles of hydrogen and oxygen. Proceedings of the National Academy of Sciences of the United States of America 2005; 102(45):16141-5.

[19] Dresselhaus M S, Dresselhaus G, Saito R, Jorio A. Raman spectroscopy of carbon nanotubes. Physics Reports 2005; 409(2):47-99.

[20] Feng X, Liu K, Xie X, Zhou R, Zhang L, Li Q, et al. Thermal analysis study of the growth kinetics of carbon nanotubes and epitaxial graphene layers on them. Journal of Physical Chemistry C 2009; 113(22):9623-31.

[21] Yaglioglu O. Carbon Nanotube Based Electromechanical Probes. Massachusetts Institute of Technology, PhD Thesis, Cambridge Mass. USA 2007.

[22] Misra A, Raney J R, Craig A E, and Daraio C, Effect of density variation and non-covalent functionalization on the compressive behavior of carbon nanotube arrays. *Nanotechnol.* 22, 425705 (2011)

[23] Suhr J, Victor P, Ci L, Sreekala S, Zhang X, Nalamasu O, et al. Fatigue resistance of aligned carbon nanotube arrays under cyclic compression. Nature Nano 2007; 2(7):417-21.

[24] Jackson, J. J.; Puretzky, A. A.; More, K. L.; Rouleau, C. M.; Eres, G.; Geohegan, D. B. Pulsed Growth of Vertically Aligned Nanotube Arrays with Variable Density. ACS Nano 2010, 4, 7573-7581.

[25] Li, X.; Cao, A.; Jung, Y. J.; Vajtai, R.; Ajayan, P. M. Bottom-up growth of carbon nanotube multilayers: unprecedented growth. *Nano Letters* 2005, 5, 1997-2000

[26] Li, X.; Ci, L.; Kar, S.; Soldano, C.; Kilpatrick, S. J.; Ajayan, P. M. Densified aligned carbon nanotube films via vapor phase infiltration of carbon *Carbon* 2007, 45, 847-851.

[27] Misra, A.; Greer, J. R.; Daraio, C. Strain rate effects in the mechanical response of polymer-anchored carbon nanotube foams. *Adv. Mater.* 2009, 21, 334-338.

[28] Ajdari, A.; Nayeb-Hashemi, H.; Vaziri, A. Dynamic crushing and energy absorption of regular, irregular and functionally graded cellular structures. *International Journal of Solids and Structures* 2011, 48, 506-516.

[29] Wang, E.; Gardner, N.; Shukla, A. The blast resistance of sandwich composites with stepwise graded cores. *International Journal of Solids and Structures* 2009, 46, 3492-3502.

[30] Cui, L.; Kiernan, S.; Gilchrist, M. D. Designing the energy absorption capacity of functionally graded foam materials. *Materials Science and Engineering A* 2009, 507, 215-225.

[31] Kiernan, S.; Cui, L.; Gilchrist, M. D. Propagation of a stress wave through a virtual functionally graded foam. *International Journal of Non-Linear Mechanics* 2009, 44, 456-468.

[32] Deck, C. P.; Vecchio, K. S. Growth of well-aligned carbon nanotube structures in successive layers. *J. Phys. Chem. B* 2005, 109, 12353-12357.

[33] Cao, A.; Zhang, X.; Wei, J.; Li, Y.; Xu, C.; Ji, L.; Wu, D.; Wei, B. Macroscopic three-dimensional arrays of fe nanoparticles supported in aligned carbon nanotubes. *J. Phys. Chem. B* 2001, 105, 11937-11940.

The invention claimed is:

1. A method for controlling mechanical properties in a carbon nanotube foam structure, the method comprising:
   synthesizing the carbon nanotube foam structure by carrying a precursor solution comprising a catalyst and a carbon source in a reaction zone by way of a carrier gas, wherein the carrier gas includes hydrogen; and
   controlling or varying a quantity of hydrogen to affect the mechanical properties of the carbon nanotube foam structure.

2. The method of claim 1, wherein synthesizing the carbon nanotube foam structure includes adopting catalyst thermal chemical vapor deposition (CVD).

3. The method of claim 1, wherein controlling or varying the quantity of hydrogen affects an average carbon nanotube diameter.

4. The method of claim 1, wherein controlling or varying the quantity of hydrogen affects a microstructure of the carbon nanotube foam structure.

5. A method for controlling mechanical properties in a carbon nanotube foam structure, the method comprising:
   synthesizing the carbon nanotube foam structure by carrying a precursor solution comprising a catalyst and a carbon source in a reaction zone by way of a carrier gas,
   controlling or varying a concentration of the carrier gas to affect the mechanical properties of the carbon nanotube foam structure, wherein controlling or varying a hydrogen concentration affects an average carbon nanotube diameter, and reducing concentration of hydrogen to increase number of walls of individual nanotube and to increase average bulk density of carbon nanotube foam structure.

* * * * *